US006700173B1

(12) United States Patent
Rodgers

(10) Patent No.: US 6,700,173 B1
(45) Date of Patent: Mar. 2, 2004

(54) ELECTRICALLY ISOLATED SUPPORT FOR OVERLYING MEM STRUCTURE

(75) Inventor: Murray Steven Rodgers, Albuquerque, NM (US)

(73) Assignee: Memx, Inc., Albuquerque, NM (US)

( * ) Notice: Subject to any disclaimer, the term of this patent is extended or adjusted under 35 U.S.C. 154(b) by 0 days.

(21) Appl. No.: 10/224,207

(22) Filed: Aug. 20, 2002

(51) Int. Cl.$^7$ ............................................. H01L 29/82
(52) U.S. Cl. ..................................................... 257/415
(58) Field of Search ................................ 257/415, 417, 257/418, 419, 704

(56) References Cited

U.S. PATENT DOCUMENTS

| | | | |
|---|---|---|---|
| 5,107,328 A | 4/1992 | Kinsman | 357/74 |
| 5,435,876 A | 7/1995 | Alfaro et al. | 156/247 |
| 5,605,489 A | 2/1997 | Gale et al. | 451/28 |
| 5,610,431 A * | 3/1997 | Martin | 257/415 |
| 5,798,283 A | 8/1998 | Montague et al. | 438/24 |
| 5,872,046 A | 2/1999 | Kaeriyama et al. | 438/465 |
| 5,923,995 A | 7/1999 | Kao et al. | 438/460 |
| 5,986,381 A | 11/1999 | Hoen et al. | 310/309 |
| 6,063,696 A | 5/2000 | Brenner et al. | 438/465 |
| 6,082,208 A | 7/2000 | Rodgers et al. | 74/406 |
| 6,133,670 A | 10/2000 | Rodgers et al. | 310/309 |
| 6,175,170 B1 | 1/2001 | Kota et al. | 310/40 |
| 6,335,224 B1 | 1/2002 | Peterson et al. | 438/114 |
| 2001/0048265 A1 | 12/2001 | Miller et al. | 310/309 |

* cited by examiner

*Primary Examiner*—Craig A. Thompson
(74) *Attorney, Agent, or Firm*—Marsh Fischmann & Breyfogle LLP

(57) ABSTRACT

MEM devices are fabricated with integral dust covers, cover support posts and particle filters for reduced problems relating to particle contamination. In one embodiment, a MEM device (10) includes an electrostatic actuator (12) that drives a movable frame (14), a displacement multiplier (16) for multiplying or amplifying the displacement of the movable frame (14), and a displacement output element (18) for outputting the amplified displacement. The actuator (12) is substantially encased within a housing formed by a cover (36) and related support components disposed between the cover (36) and the substrate (38). Electrically isolated support posts may be provided in connection with actuator electrodes to prevent contact between the cover and the underlying electrodes. Such a support post may also incorporate an electric filter element for filtering undesired components from a drive signal. Particle filters may be provided in connection with etch release holes or other openings in order to further protect against particle contamination.

13 Claims, 23 Drawing Sheets

ELECTRICALLY ISOLATED SUPPORT FOR OVERLYING MEM STRUCTURE

FIELD OF THE INVENTION

The present invention generally relates to micromechanical or microelectromechanical (collectively "MEM") systems and, in particular, to the provision and use of covers in connection with components or substrate areas of such systems. Such covers extend over and may substantially encase the protected areas or components to protect against particle contamination.

BACKGROUND OF THE INVENTION

MEM systems include highly miniaturized devices that employ electrical and/or mechanical components formed on a substrate. There are a number of fabrication technologies, collectively known as micromachining, for producing MEM systems. One type of micromachining process is surface micromachining. Surface micromachining generally involves deposition and photolithographic patterning of alternate layers of structural material (typically polycrystalline silicon, termed polysilicon) and sacrificial layers (typically silicon dioxide, termed oxide) on a silicon wafer substrate material. Using a series of deposition and patterning steps, functional devices are constructed layer by layer. After a device is completed, it is released by removing all or some of the remaining sacrificial material by exposure to a selective etchant such as hydrofluoric acid, which does not substantially attack the polysilicon layers.

A potential problem in connection with MEM systems relates to particle contamination. Particle contamination can potentially impair or disable a system by interfering with the electrical signals and/or mechanical movements of some or all of the electrical and/or mechanical devices. Electrostatic components, such as actuators, are particularly susceptible to particle contamination as particles may be electrically attracted to such components and may cause electrical shorts. Various movable elements may be susceptible to mechanical interference due to particle contamination. Such contamination can occur during construction/assembly or during operation. Completed systems are typically packaged so as to reduce exposure to potential contaminants from the ambient environment, but significant levels of contaminants may still occur within such packaging, thereby reducing yield and potentially allowing for malfunctions after system deployment. In many environments, including MEM-based optical switches, such malfunctions could entail substantial expense and inconvenience, e.g., associated with switch down time, network reconfiguration and repair or replacement.

SUMMARY OF THE INVENTION

The present invention is directed to shielding components of a MEM system or substrate areas (together with any overlying structure) from particle contamination. In this manner the yield and reliability in operation of MEM systems can be improved. Additionally, reduced susceptibility of MEM systems to particle contamination allows for construction and assembly of MEM systems under more practical conditions relating to cleanliness, thereby reducing costs. The invention thereby facilitates more practical and cost effective MEM system construction and assembly, including for high criticality applications such as MEM-based optical switches.

In accordance with one aspect of the present invention, a cover is provided to protect an active component of a MEM apparatus from particle contamination. The cover extends over and, preferably, substantially encases the active component. The associated MEM apparatus includes a substrate, an active component formed on the substrate, and a cover formed on the substrate and extending over the active component. An associated process involves establishing an active component on a substrate and establishing a cover on the substrate extending over the active component. The active component and cover are preferably formed on the substrate by a surface micromachining process.

The active component may include an electrostatic element and/or a movable element. In this regard, an electrostatic actuator is an example of a component that includes both electrostatic and movable elements. As noted above, electrostatic elements are a particular concern with respect to particle contamination because such elements may attract charged particles and such particles may cause short circuits or other malfunctions. In this regard, electrostatic components or elements include components that receive a voltage in operation such that an electrical potential is established relative to other components or structure of the device. Similarly, movable elements are a concern with respect to particle contamination because particles may mechanically interfere with movement.

The cover may extend over the entirety of the active component or over an area of the component, e.g., a critical area with respect to movement or likelihood of particle attraction. It will be appreciated that in some cases, such as typical actuator implementations, the cover will include openings or otherwise terminate so as to allow the covered component to mechanically and/or electrically interface with cooperating elements. Moreover, the cover may be an uninterrupted web of material or may be intermittent (e.g., formed as a grid or screen) or otherwise include openings. In this regard, openings may be provided to facilitate penetration of an etchant during a release process. In cases where the cover includes openings, such openings are preferably dimensioned to minimize penetration of potentially harmful particles, e.g., having a maximum dimension of less than about 5 microns and, more preferably, less than about 2 microns. Filters may be provided in connection with such openings to further reduce the potential for particle contamination.

In one embodiment, the MEM apparatus is an optical control apparatus such as for moving a micromirror, microlens, shutter or other movable optical component. The apparatus includes: a movable optical component; an actuator mechanism, formed on a substrate, for effecting movement of the optical component; and a cover supported on the substrate and extending over the actuator mechanism. The actuator is preferably movable in response to electric control signals and may include at least one electrostatic element and at least one movable link for use in transmitting motion to the optical component. The cover may extend over at least a portion of the electrostatic element and/or link. Such an apparatus may be implemented in connection with micromirror-based optical systems such as 1×N or N×N optical cross-connect switches, multiplexers, demultiplexers, spectrometers, etc.

It has been recognized that structural issues have the potential to interfere with successful implementation of covers, or other large area structures, for certain applications. In particular, in order to provide the desired particle protection in connection with certain components such as certain electrostatic actuators, the cover may be required to extend over a substantial area, e.g., the cover may have a maximum dimension of greater than hundreds of microns or even greater than several millimeters. In such cases, the cover may be drawn along an axis transverse to the substrate surface (e.g., down towards underlying structure) so as to potentially cause short circuits or otherwise interfere with operation of adjacent components or prevent proper release. This may be a particular concern where the cover extends over very large areas or where the cover extends over electrostatic elements that may attract the cover. Other forces that may act on the cover include meniscus forces, stiction and loads from interconnected structure.

In this regard, in accordance with another aspect of the present invention, at least one support structure such as a post is used to support an overlying structure of a MEM apparatus. The corresponding apparatus includes: a substrate; an active component supported on the substrate and extending across a first area of the substrate; an overlying structure supported on the substrate and extending over the first area; and a support structure disposed in the first area for supporting the overlying structure. The active component may include an electrostatic and/or a movable element. The overlying structure may be a cover or other element. The support structure preferably extends across space occupied by active component between the overlying structure and the substrate. For example, the support structure may extend from the substrate to the overlying structure.

The support structure can be implemented so as to minimize the potential for electrical or mechanical interference with the active component. In this regard, where the active component includes movable elements, the position of the support structure can be selected with due regard for the expected range of motion of the movable elements so as to avoid mechanical interference between the support structure and movable elements. Where the active component includes electrostatic elements, the support structure may be configured to avoid disruption or contact with elements and/or may be otherwise electrically isolated therefrom.

According to another aspect of the present invention, an electronic filter may be integrally formed as part of a MEM apparatus. Various types of MEM devices include conductors for transmitting signals such as control signals for controlling movement or other operation of active components. In some cases, very accurate control of these components may be required. Unfortunately, high performance microelectromechanical actuation systems may be susceptible to very low levels of electrical noise or other artifacts of the control signals. The potential for such problems increases with progressive miniaturization.

An apparatus according to this aspect of the present invention includes: a substrate; an electrical conductor supported on the substrate; and a filter formed on the substrate for filtering artifacts from an electrical signal transmitted by the conductor. For example, the filter may function to apply a capacitance in the pathway of the conductor or in parallel with an electrical feature of the conductor pathway. The filter may thereby provide a frequency dependent filtering function. In one embodiment, filter material is formed in proximity to the conductor but separated from the conductor by air or insulating material. The filter material may be grounded or otherwise controlled to have desired characteristics. A capacitance is thereby established between the conductor and adjacent structure. The capacitance may be selected to impart desired filtering characteristics, e.g., through appropriate selection of materials, dimensions, configurations and electrical properties.

BRIEF DESCRIPTION OF THE DRAWINGS

For a more complete understanding of the present invention and further advantages thereof, reference is now made to the following Detailed Description taken in conjunction with the drawings, in which.

DETAILED DESCRIPTION

Figure 1:
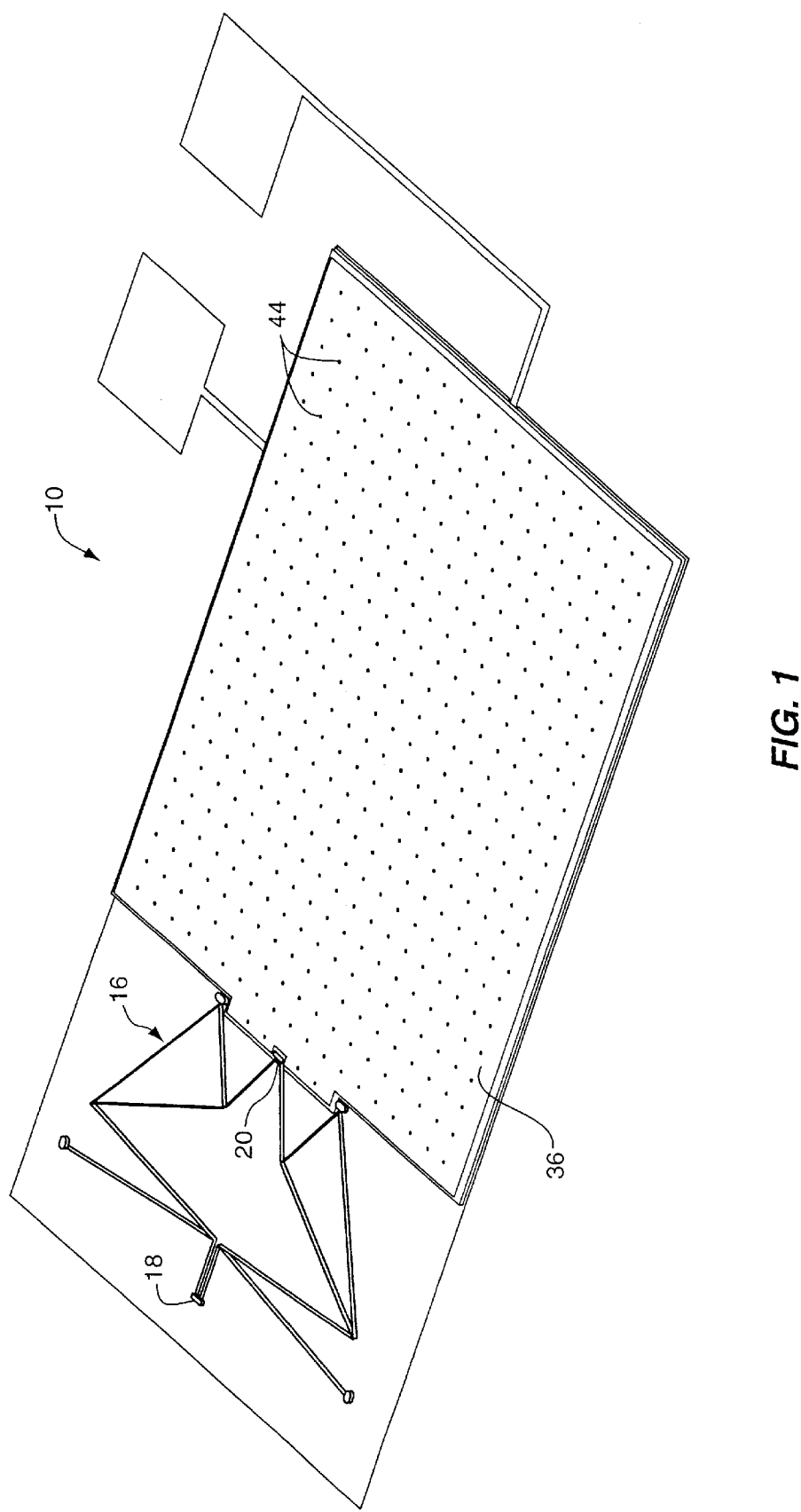
FIG. 1 is a perspective view of a MEM device including a dust cover in accordance with the present invention.

Reference will now be made to the accompanying drawings, which at least assist in illustrating the various pertinent features of the present invention. For purposes of illustration, the following description is related to the formation of covers and support posts for covers or other overlying layers for microelectromechanical (MEM) systems, although it will be appreciated that the such structure is useful for both micromechanical and microelectromechanical systems. In addition, one or more micro-devices or microstructures may define any given micromechanical or microelectromechanical system.

Surface micromachining is a preferred type of technique for fabricating the structures described herein, although other techniques may be utilized as well. Moreover, in certain instances it may be desirable to use a combination of two or more fabrication techniques to define a given MEM system. Since surface micromachining is a preferred fabrication technique for the MEM systems described herein, the basic principles of surface micromachining will first be described. Initially, various surface micromachined microstructures and surface micromachining techniques are disclosed in U.S. Pat. No. 5,783,340, issued Jul. 21, 1998, and entitled "METHOD FOR PHOTOLITHOGRAPHIC DEFINITION OF RECESSED FEATURES ON A SEMICONDUCTOR WAFER UTILIZING AUTO-FOCUSING ALIGNMENT"; U.S. Pat. No. 5,798,283, issued Aug. 25, 1998, and entitled "METHOD FOR INTEGRATING MICROELECTROMECHANICAL DEVICES WITH ELECTRONIC CIRCUITRY; U.S. Pat. No. 5,804,084, issued Sep. 8, 1998, and entitled "USE OF CHEMICAL MECHANICAL POLISHING IN MICROMACHINING"; U.S. Pat. No. 5,867,302, issued Feb. 2, 1999, and entitled "BISTABLE MICROELECTROMECHANICAL ACTUATOR"; and U.S. Pat. No. 6,082,208, issued Jul. 4, 2000, and entitled "METHOD FOR FABRICATING FIVE-LEVEL MICROELECTROMECHANICAL STRUCTURES AND MICROELECTROMECHANICAL TRANSMISSION FORMED, the entire disclosures of which are incorporated by reference in their entirety herein.

Surface micromachining generally entails depositing typically alternate layers of structural material and sacrificial material using an appropriate substrate which functions as the foundation for the resulting microstructures. A dielectric isolation layer will typically be formed directly on an upper surface of the substrate on which a MEM system is to be fabricated, and a structural layer will be formed directly on an upper surface of the dielectric isolation layer. This particular structural layer is typically patterned and utilized for establishing various electrical interconnections for the MEM system, which is thereafter fabricated thereon. Other layers of sacrificial and structural materials are then sequentially deposited to define the various microstructures and devices of the MEM system. Various patterning operations may be executed on one or more of these layers before the next layer is deposited to define the desired microstructure. After the various microstructures are defined in this general manner, the desired portions of the various sacrificial layers are removed by exposing the "stack" to one or more etchants. This is commonly called "releasing." During releasing, at least certain of the microstructures are released from the substrate to allow some degree of relative movement between the microstructure(s) and the substrate. In certain situations, not all of the sacrificial material used in the fabrication is removed during the release. For instance, sacrificial material may be encased within a structural material to define a microstructure with desired characteristics (e.g., a prestressed elevator microstructure). Also, portions of the sacrificial layers may be retained for support.

Surface micromachining can be done with any suitable system of a substrate, sacrificial film(s) or layer(s), and structural film(s) or layer(s). Many substrate materials may be used in surface micromachining operations, although the tendency is to use silicon wafers because of their ready availability and material compatibility. The substrate again is essentially a foundation on which the microstructures are fabricated. This foundation material is generally stable to the processes that are being used to define the microstructure(s) and does not adversely affect the processing of the sacrificial/structural films that are being used to define the microstructure(s). With regard to the sacrificial and structural films, the primary differentiating factor is a selectivity difference between the sacrificial and structural films to the desired/required release etchant(s). This selectivity ratio is preferably several hundred to one or much greater, with an infinite selectivity ratio being ideal, however, the etch selectivity in some cases may be 5:1 or even lower. Examples of such a sacrificial film/structural film system include: various silicon oxides/various forms of silicon; poly germanium/poly germanium-silicon; various polymeric films/various metal films (e.g., photoresist/aluminum); various metals/various metals (e.g., aluminum/nickel); polysilicon/silicon carbide; silicone dioxide/polysilicon (i.e., using a different release etchant like potassium hydroxide, for example).

As discussed above, one aspect of the present invention relates to providing a dust cover to protect particular components or areas of a MEM system from particle contamination. In the following discussion, the invention is set forth in the context of a dust cover for covering and substantially encasing an electrostatic actuator of a MEM system. The dust cover has particular advantages for such an application because, as noted above, components with electrostatic and/or moving elements, such as electrostatic actuators, are particularly susceptible to short circuits, mechanical obstruction, or other malfunctions due to particle contamination. It will be appreciated, however, that the invention is not limited to such a context.

Figure 8:
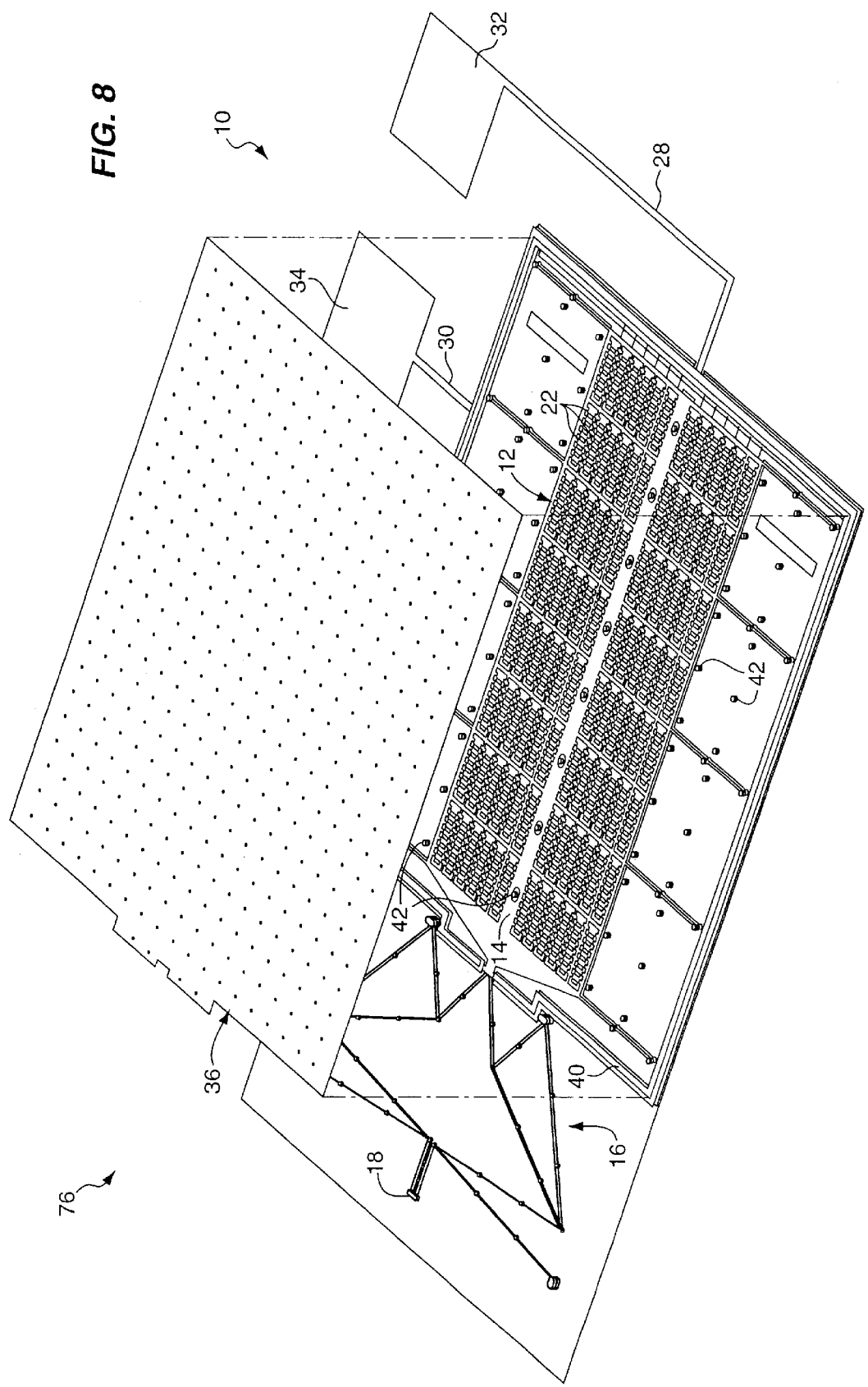
FIG. 8 is a perspective view showing a fourth structural layer of the MEM device of FIG. 1.

Referring first to FIGS. 1 and 8, perspective views of a MEM device 10 are shown. The illustrated device 10 is an electrostatic actuator such as may be used for effecting movement of a movable component. The nature of the movable component depends on the purpose of the MEM system. One example would be a movable mirror of an optical switch. An example of such a device is disclosed in U.S. patent application Ser. No. 09/966,963, entitled "Large Tilt Angle MEM Platform", filed on Sep. 27, 2001, which is incorporated herein by reference in its entirety. The device 10 generally includes an electrostatic actuator 12 (FIG. 8), that drives a movable frame 14, a displacement multiplier 16 for multiplying or amplifying the displacement of the movable frame 14, and a displacement output element 18 for outputting the amplified displacement. The structure and operation of such a displacement multiplier 16 is generally set forth in U.S. patent application Ser. No. 6,174,179, by Kota et al., issued on Jan. 16, 2001, which is incorporated herein by reference in its entirety. Generally, the displacement multiplier is driven at input port 20 by the movable frame 14. The displacement multiplier 16 functions to amplify this input motion so that displacement output element 18 moves in concert with the movable frame 14 but across a range of movement that is substantially greater than that of the movable frame 14. The output element 18, in turn, is mechanically linked to the movable mirror or other element that is driven, at least in part, by the device 10.

Figure 11:
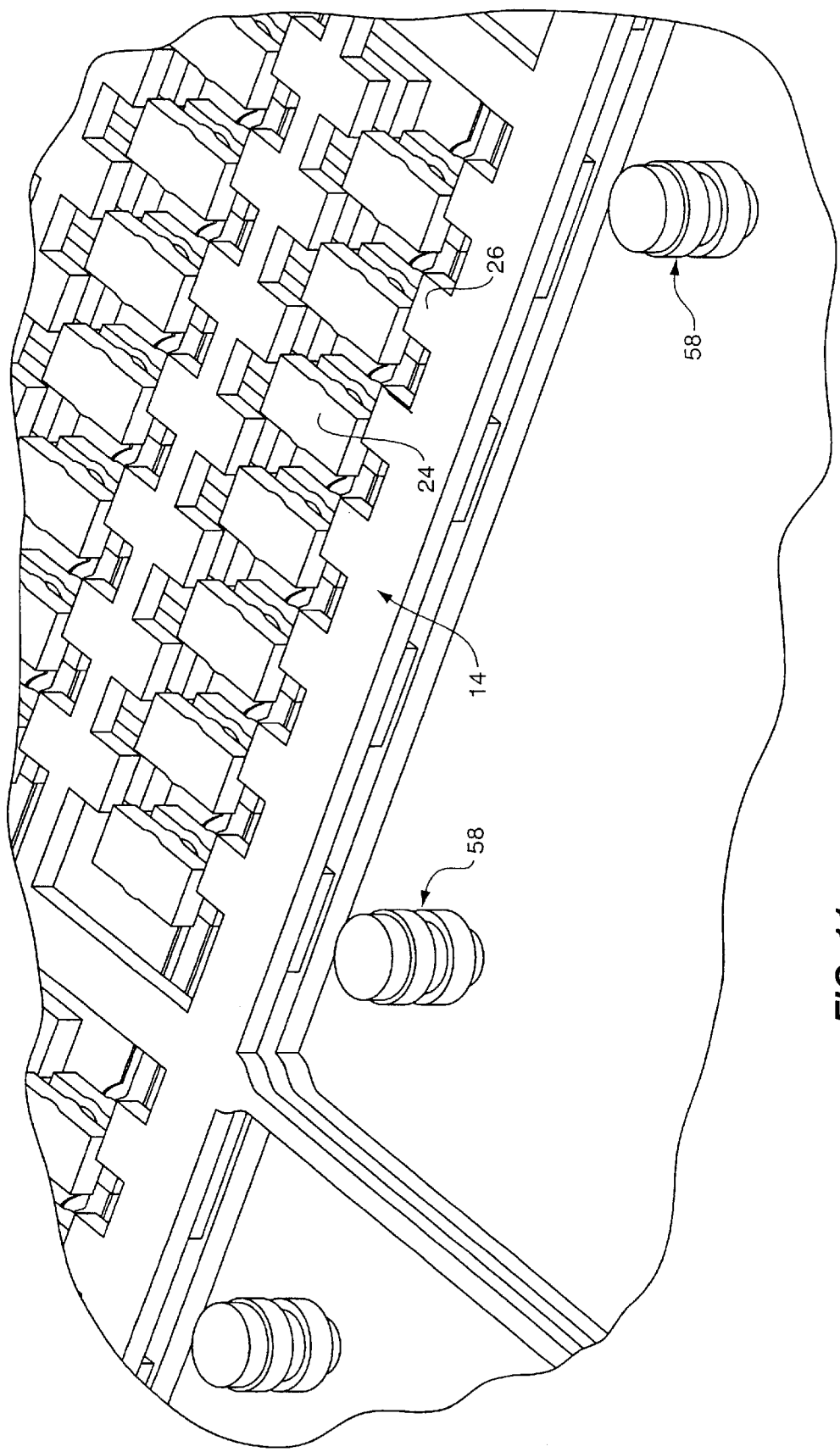
FIG. 11 is a close up perspective view showing the relative geometry of the outer support posts and electrodes of the MEM device of FIG. 1.

As generally shown in FIGS. 8 and 11, and described in more detail below, the actuator 12 includes a number of electrodes 22 that are used to drive the frame 14. These include fixed electrodes 24 and movable electrodes 26. Electrical signals can be applied to the electrodes 22 via leads 28 and 30 that terminate in bonding pads 32 and 34. Accordingly, a signal such as a voltage potential applied across the bonding pads 32 and 34 is, in turn, applied at the electrodes 22. By applying such a signal at the electrodes 22, an electrostatic force is selectively applied as between the fixed and movable electrodes 24 and 26 so as to move the movable electrodes 26 relative to the fixed electrodes 24. The movable electrodes 26 are associated with the movable frame 14 such that the control signals are used to controllably drive the frame 14 and, in turn, the displacement output element 18.

As discussed above, MEM components that include an electrostatic and/or a movable element are particularly susceptible to problems associated with particle contamination. The illustrated actuator 12 is an example of a component that includes both electrostatic and movable elements. In particular, as discussed above, a voltage potential is applied across the fixed and movable electrodes 24 and 26 in operation in order to create a drive force for effecting movement of the frame 14. Such potentials may attract particles. Moreover, very close spacing between the movable and fixed electrodes 24 and 26 may be achieved during operation. Thus, very small particles, e.g., on the order of one micron, may create short circuits. Furthermore, it is apparent that even small particles could mechanically interfere with movement of the movable electrodes 26, the frame 14 or other movable elements.

Figure 9A:
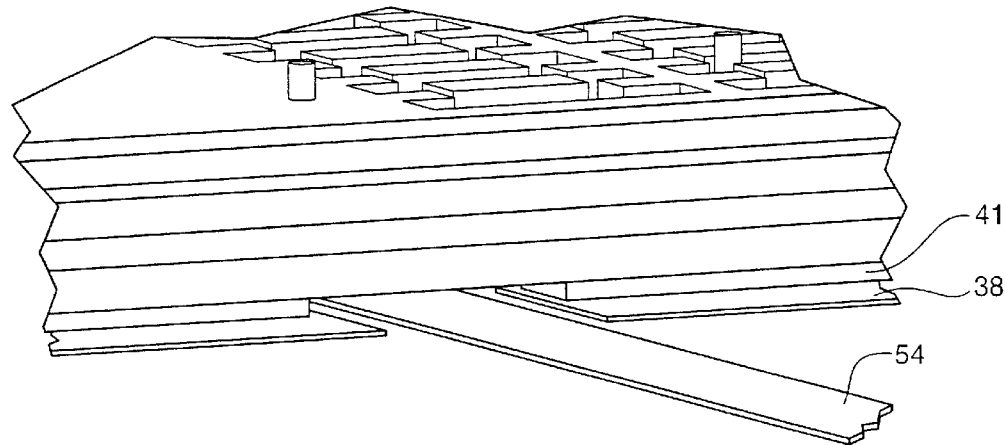
FIG. 9A is a perspective, partial cross-sectional view showing an electrical contact of the MEM device of FIG. 1.

Thus, in accordance with the present invention, the actuator 12 is substantially encased within a housing formed by a cover top, cover walls and related support components disposed between the cover top 36 and the electrical interconnect layer 38 (FIG. 9A). The cover top 36 is shown in FIG. 1. In FIG. 8, the cover top 36 is illustrated as being raised so that the underlying components including the actuator 12, peripheral support structure 40, and support posts 42 can be seen. It will be appreciated that the cover top 36 and cover support structure 40 do not necessarily sealingly enclose the actuator. In this regard, as shown in FIG. 1, the cover top 36 includes a number of etch release holes 44. These etch release holes 44 allow for penetration of an etchant to facilitate the release process discussed above. It will be appreciated that, in the absence of such release holes 44, complete and timely penetration of the etchant across the area of the actuator 12 would be difficult. These etch release holes 44 are preferably distributed substantially uniformly across the area of the cover 36 and may be dimensioned to reduce penetration of potentially harmful particles. For example, in the illustrated embodiment, etch release holes 44 may have a diameter of approximately 1.25 microns.

Figure 10A:
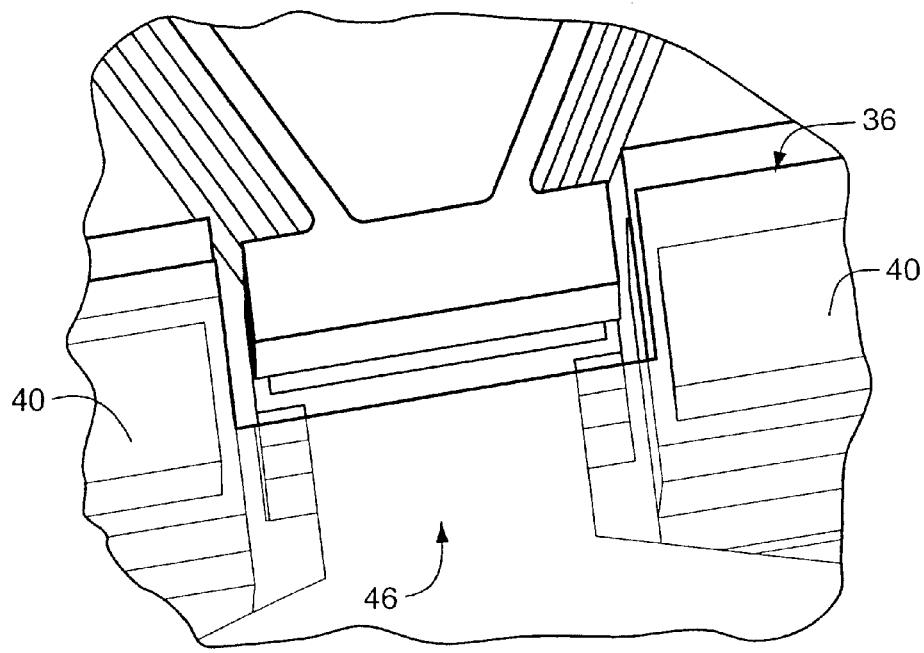
FIGS. 10A and 10B show a close up of the interface between the actuator and the displacement multiplier of the MEM device of FIG. 1.
Figure 10B:
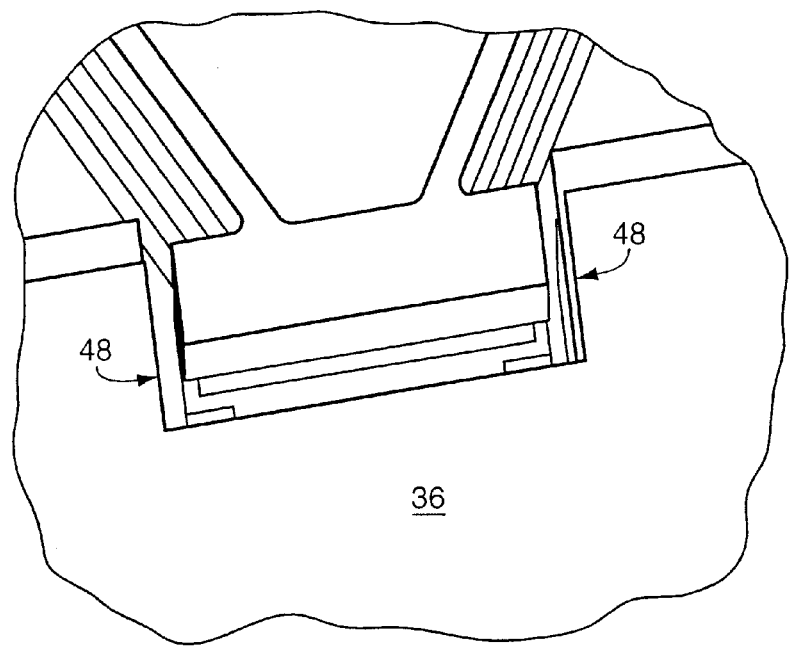

The effectiveness of the cover top 36 in preventing particle contamination may further be enhanced through the use of filters in connection with the etch release holes 44, as discussed below. The illustrated cover top 36 and related support assembly also provide an opening 46 (See, FIGS. 10A and 10B, where the cover top 36 is shown as being transparent in FIG. 10A for purposes of illustration) to permit the frame 14 to interface with the displacement multiplier 16 and associated structure. This opening 46 can be dimensioned so as to allow the desired mechanical interface between the frame 14 and displacement multiplier 16 while minimizing the opportunity for particle penetration. In the illustrated embodiment, the opening 46 provides a clearance 48 of no more than about 2 microns and more preferably no more than about 1 micron between the moving structure of the frame 14 on the one hand and the peripheral cover support structure 40 and cover 36 on the other hand.

FIGS. 2–8 illustrate the MEM device 10 in layer by layer detail. It will be appreciated that FIGS. 2–8 do not fully illustrate the production sequence. For example, in FIGS. 2–8, the various sacrificial layers are shown as they would be formed after the release step using the etchant. Thus, FIGS. 2–8 illustrate the form of the finished product layer by layer for purposes of clarity.

Figure 2:
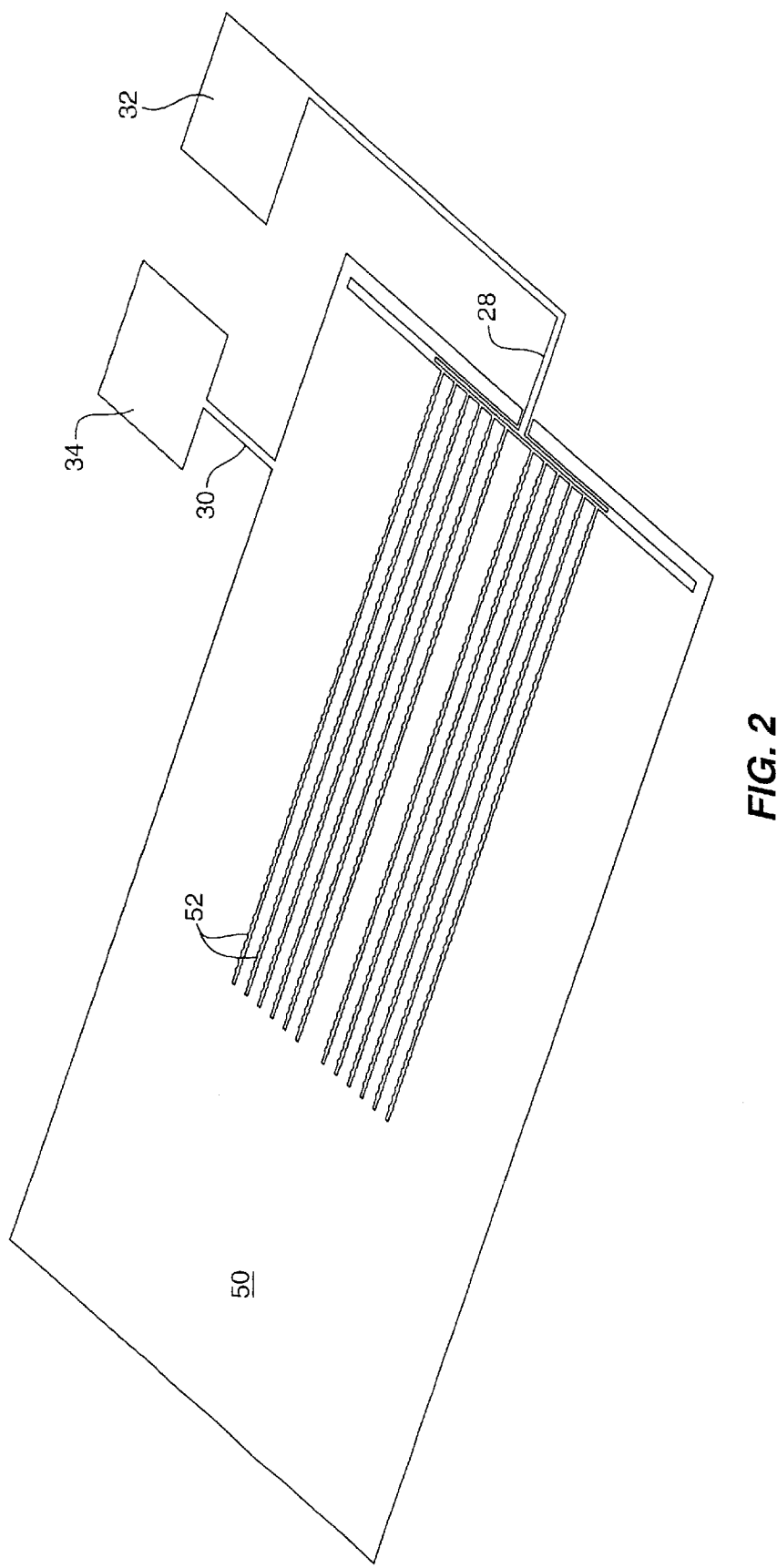
FIG. 2 is a perspective view of a base structural layer of the MEM device of FIG. 1.

As previously discussed, a dielectric isolation layer is generally first provided on the substrate. A first structural layer is then usually formed on the dielectric isolation layer. This initial structural layer is patterned with conductors and utilized for establishing various electrical interconnections for the MEM device. This structural layer 50 and the associated conductors 52 are shown in FIG. 2. In particular, the leads 28 and 30 to the bonding pads 32 and 34 and conductors 52 for forming connections to the electrodes 22 (not shown in FIG. 2) can be seen. These conductors are used to provide voltage signals to drive the electrodes 22.

FIG. 9A shows the connection of the voltage electrical input 54 to the electrical interconnect layer 50 of FIG. 2. As shown in FIG. 9A, the connection is formed from beneath. That is, the electrical input 54 is connected to the electric structural layer 50 via penetration through layer 38 and the dielectric isolation layer 41.

Figure 9B:
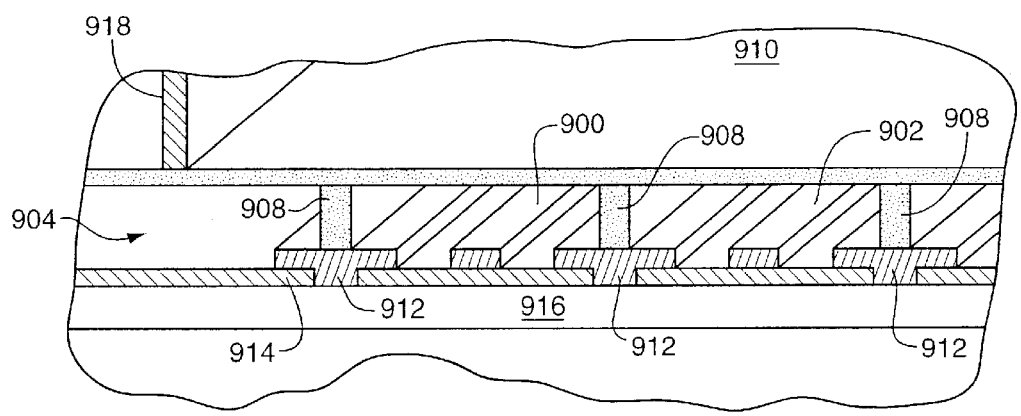
FIG. 9B is a perspective partial cross-sectional view showing shielded electrodes in combination with a cover in accordance with the present invention.

The illustrated electrical interface accommodates shielded conductors as described in copending U.S. patent application Ser. No. 10/099,720 entitled "Multi-Level Shielded Multi-Conductor Interconnect Bus for MEMS", which is incorporated herein by reference. In particular, that application discloses conductors that are electrically isolated from adjacent conductors by way of certain isolation structure. Such isolation structure may be incorporate a cover structure as shown in simplified form in FIG. 9B. In particular, FIG. 9B shows two electrode lines 900 and 902 substantially encased within shield structure 904. Although not shown, it will be appreciated that additional electrical and/or mechanical structure such as an actuator assembly may be included in the device 906 with appropriate connections to the lines 900 and 902. Although two lines 900 and 902 are shown, it will be appreciated that certain actuator designs including those described above, can be implemented with a single drive line and a ground. In such cases, one of the conductors 900 or 902 could be omitted or branched off to provide separate drive circuitry.

In the illustrated embodiment, the shield structure includes shield walls 908, extending longitudinally along the length of the lines 900 and 902, supporting a shield cover 910, such that the walls 908 and cover 910 substantially encase the lines 900 and 902 for particle protection. The walls 908 are supported on bases 912 that extend through the dielectric layer 914 to the substrate 916. In this manner, the entire structure 904, together with any desired additional components or device 906 can be maintained at a ground or reference potential, thereby improving isolation between the lines 900 and 902 and reducing cross-talk or interference. The illustrated device 906 includes support walls 918 to support further structures as desired.

Figure 3:
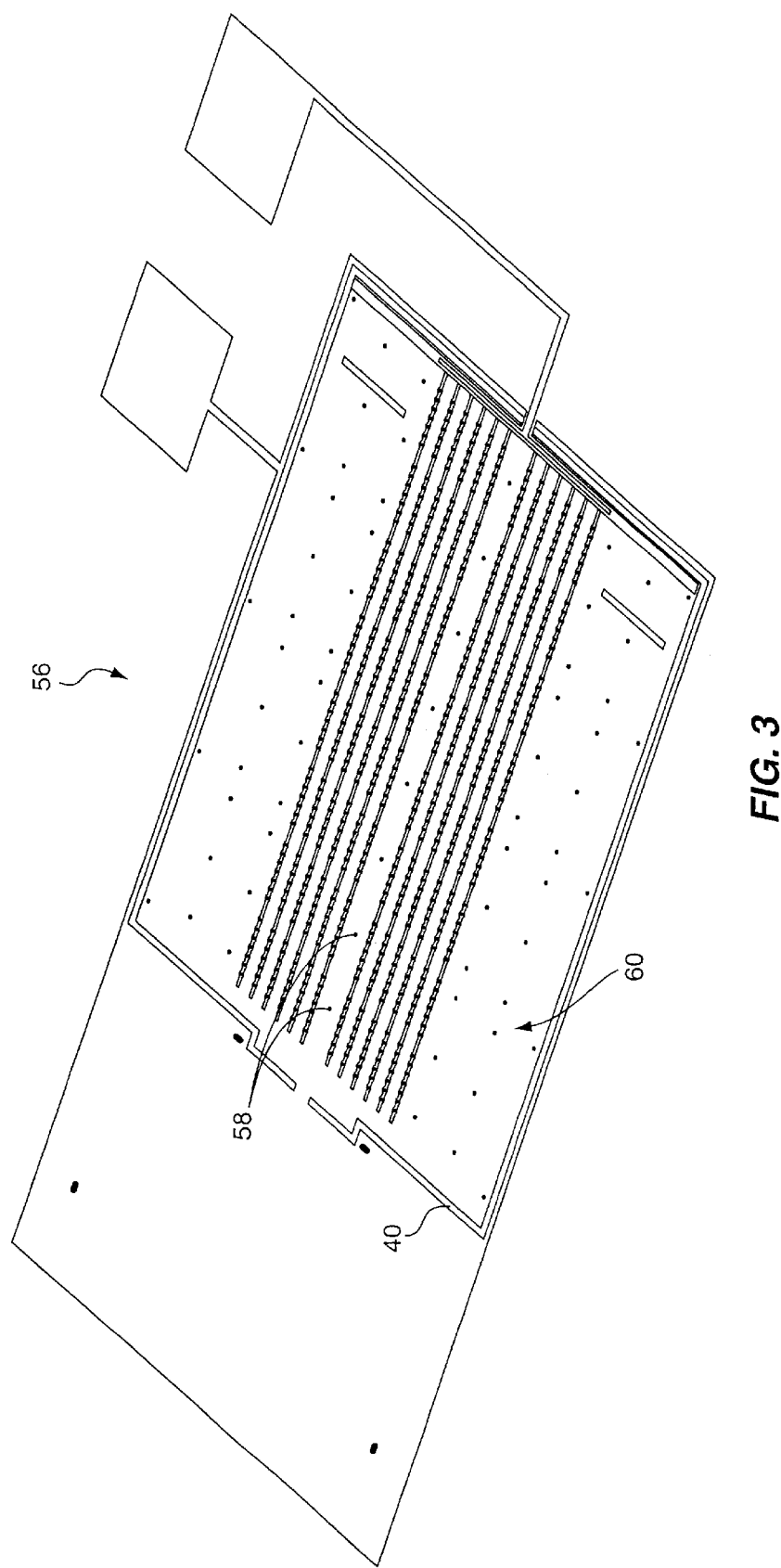
FIG. 3 is a perspective view showing a first sacrificial layer of the MEM device of FIG. 1.

FIG. 3 shows the first sacrificial layer 56 which forms the first layer of the peripheral cover support structure 40, and various support posts for supporting the cover top 36, actuator electrodes 24 and displacement multiplier 16. These ports include outer support posts 60 and central support posts 58 for supporting the cover top 36 as discussed in more detail below.

Figure 4:
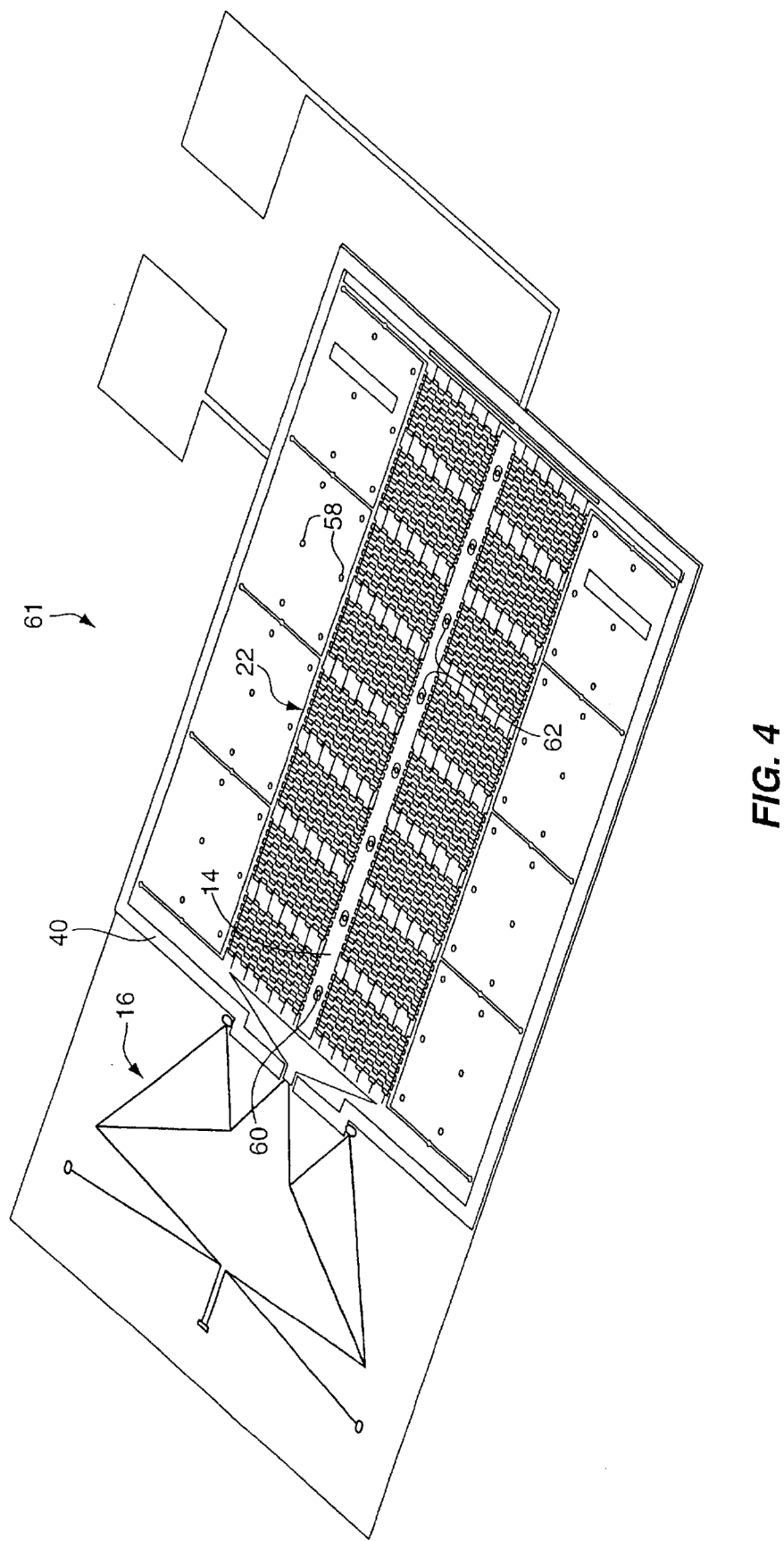
FIG. 4 is a perspective view showing a second structural layer of the MEM device of FIG. 1.

FIG. 4 illustrates the next structural layer 61 which forms a first layer of the electrodes 22, frame 14, and displacement multiplier 16. This structural layer also forms another layer of the peripheral cover support structure 40, outer support posts 58, and central support posts 60 for supporting the cover top 36.

As shown, the frame portion of the structural layer is formed with elongate slots 62 around the central support posts 60. These elongate slots 62 accommodate reciprocating motion of the frame 14 without mechanical interference due to the central support posts 60.

Figure 5:
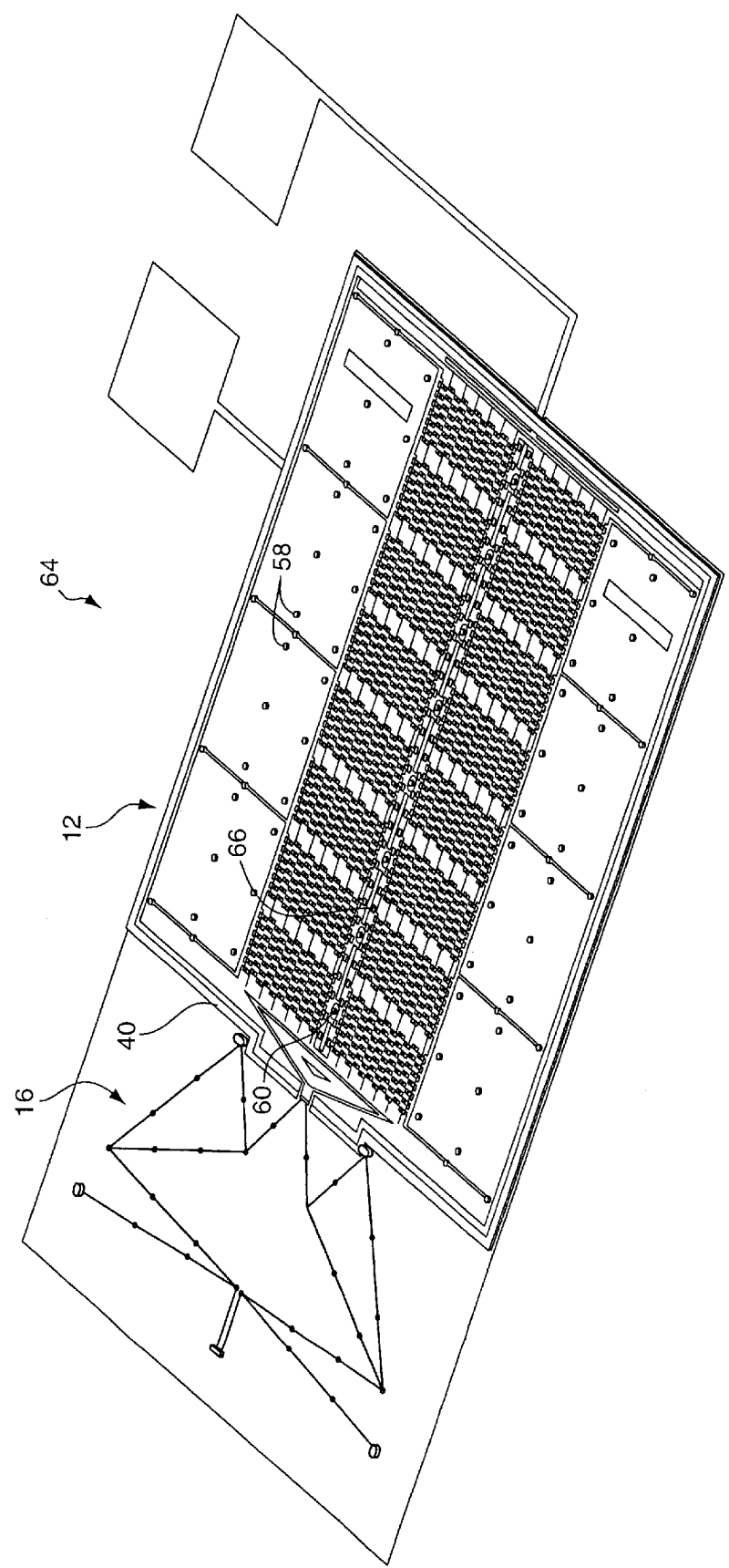
FIG. 5 is a perspective view showing a second sacrificial layer of the MEM device of FIG. 1.

FIG. 5 illustrates the next sacrificial layer 64. This sacrificial layer 64 is used to provide a number of support posts 66 for interconnecting upper and lower levels of the actuator 12 and the displacement multiplier 16. This layer 64 also provides a further layer of the peripheral cover support structure 40, outer support posts 58 and center support posts 60 for supporting the cover top 36.

Figure 6:
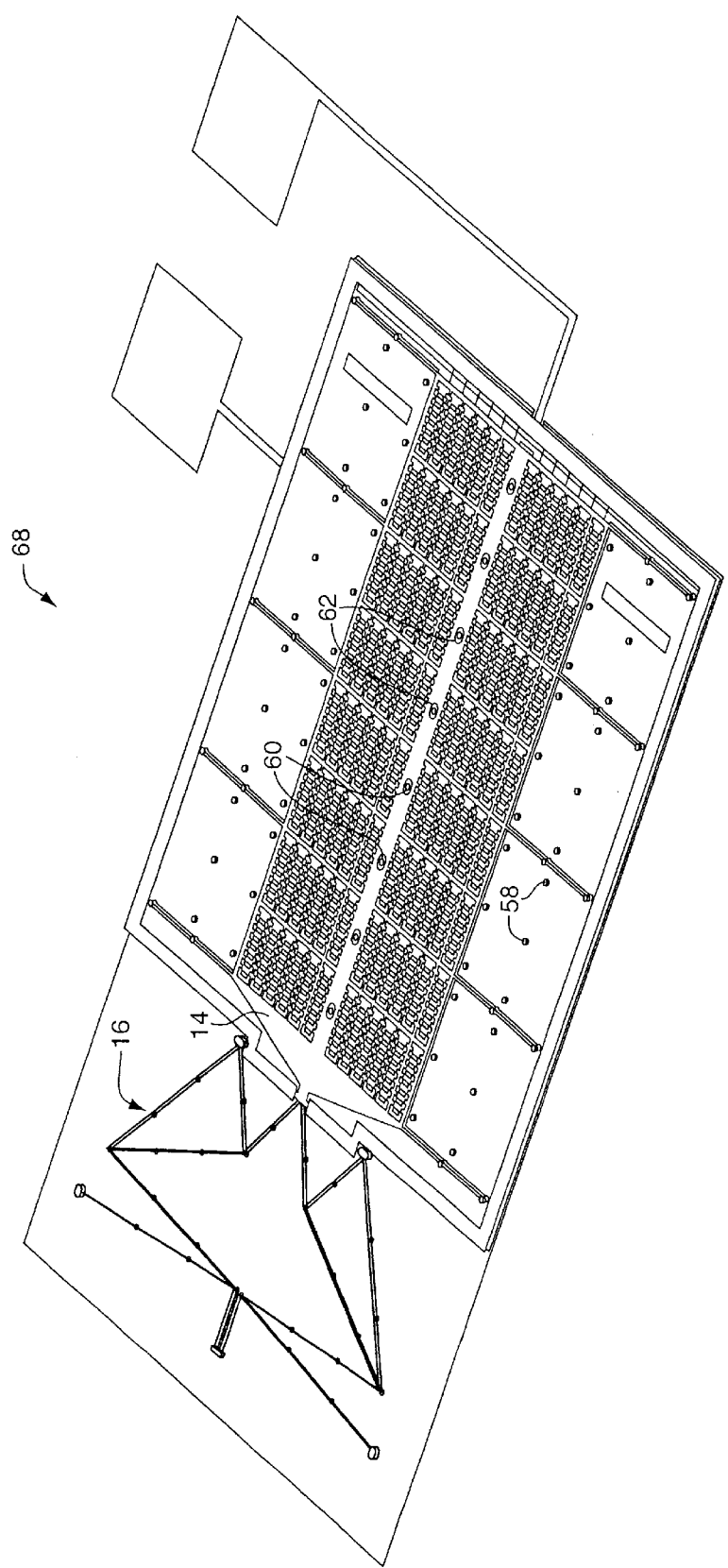
FIG. 6 is a perspective view showing a third structural layer of the MEM device of FIG. 1.

FIG. 6 illustrates the next structural layer 68. This structural layer 68 forms an upper layer of the movable frame 14, as well as an upper layer of the displacement multiplier 16. This layer 68 also provides the next layer of the peripheral cover support structure 40, outer support posts 58 and center support posts 60 for supporting the cover top 36.

Figure 12:
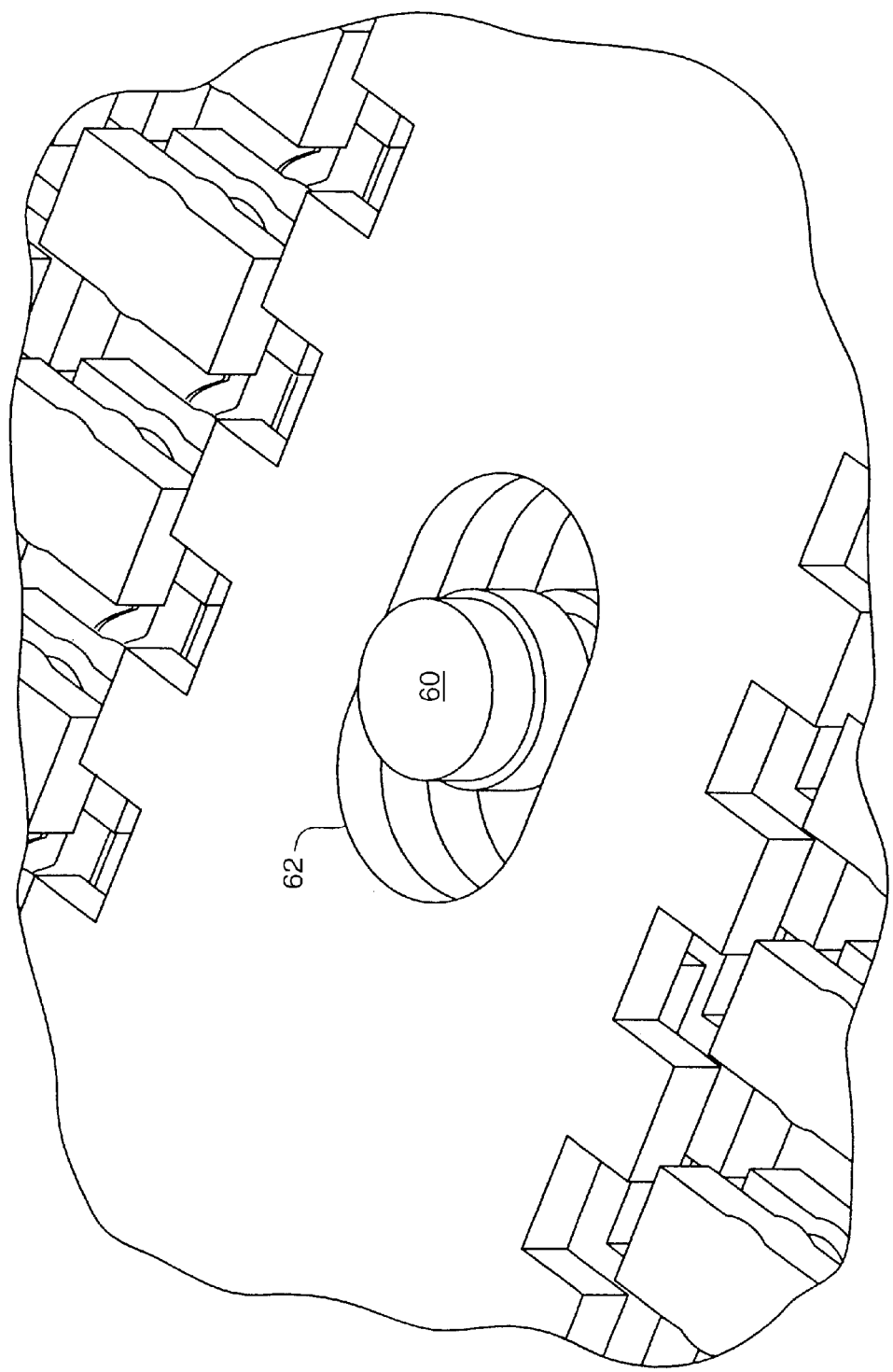
FIG. 12 is a perspective, close up view showing the interface between the central support posts and the movable frame of the MEM device of FIG. 1.

Again, the frame portion of this structural layer 68 is formed with elongate slots 62 around the central support posts 60. These elongate slots 62 accommodate reciprocating motion of the frame 14 without mechanical interference due to the central support posts 60. This geometry is best seen in FIG. 12.

Figure 7:
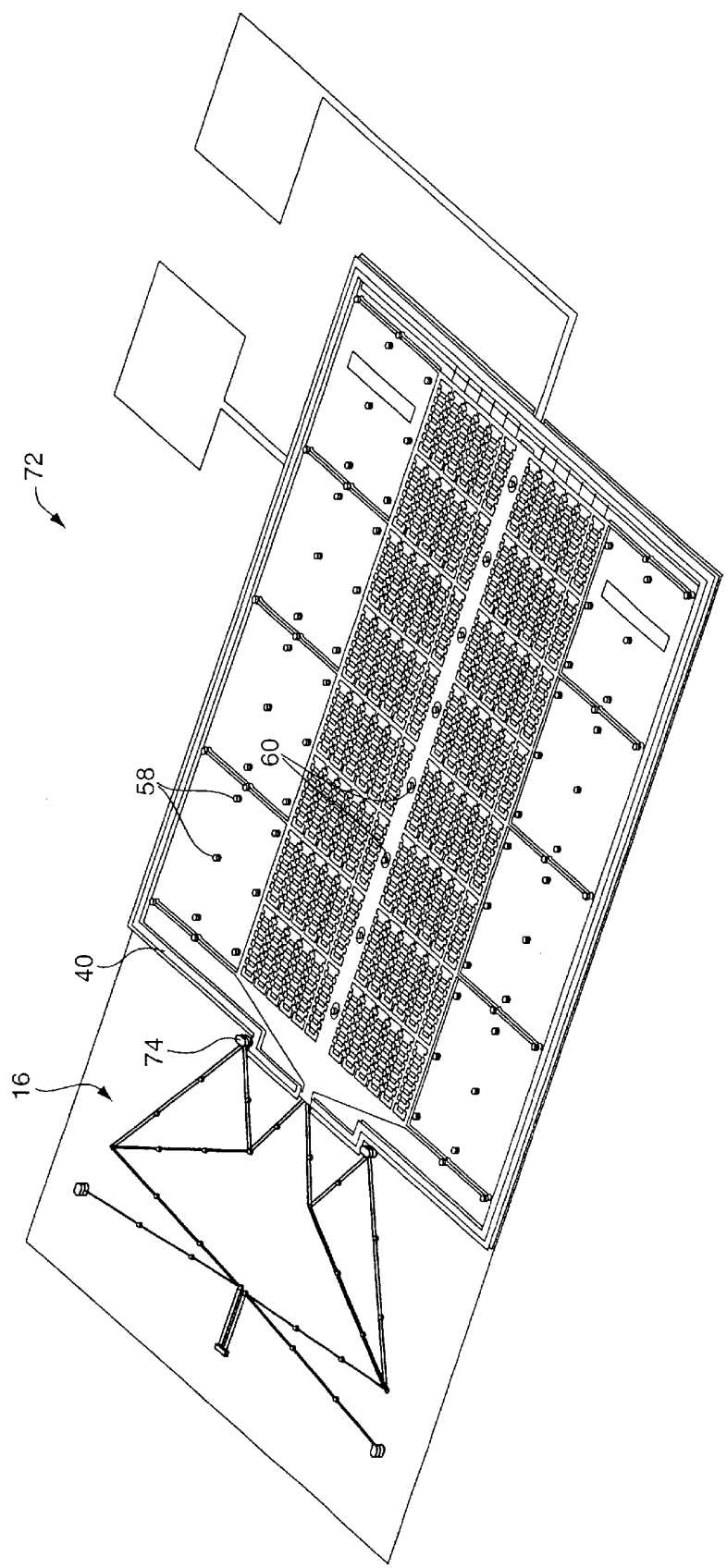
FIG. 7 is a perspective view showing a third sacrificial layer of the MEM device of FIG. 1.

FIG. 7 shows the next sacrificial layer 72. This layer 72 provides the next layer of the peripheral cover support structure 40, outer posts 58 and central posts 60 for supporting the cover top 36. In particular, this sacrificial layer 72 provides a vertical separation between the cover top 36 and the actuator assembly 12. This sacrificial layer also is used to provide support posts 74 for an upper layer of the displacement multiplier 16.

Finally, FIG. 8 shows the uppermost structural layer 76 of the illustrated MEM device 10. This layer 76 is used to form the cover top 36 (shown as being raised for purposes of illustration) and the uppermost layer of the displacement multiplier 16.

FIG. 11 shows a close-up of the outer posts 58 fabricated around the electrode region. These posts 58 are preferably positioned close to the electrode region to reduce the likelihood of contact between the cover top 36 and the electrodes 24 and 26. The various sacrificial and structural layers of the posts 58 can be readily seen in this perspective view.

Figure 13A:
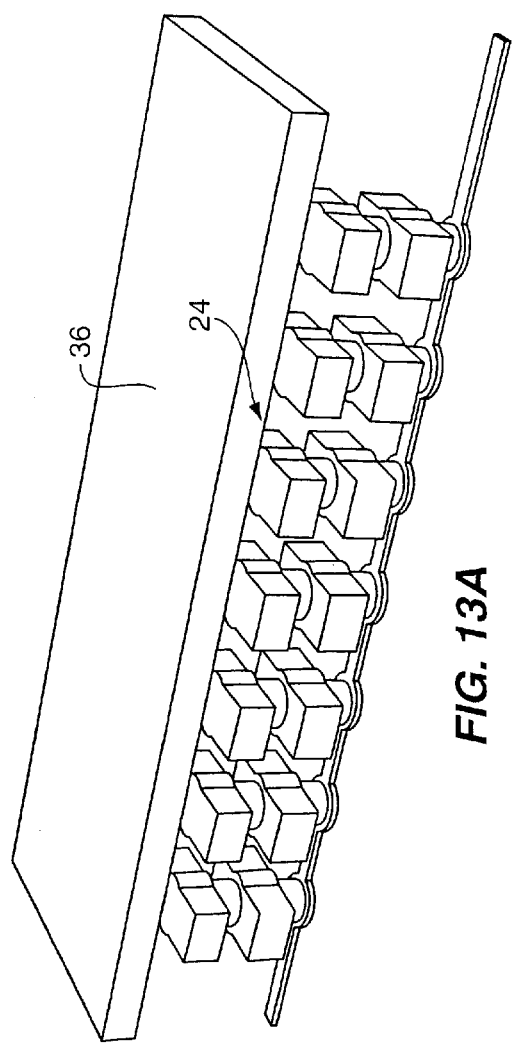
FIG. 13A is a perspective view showing the relative geometry between a portion of the cover and underlying electrodes of the MEM device of FIG. 1.

As noted above, the cover top 36 is generally maintained at ground potential. The underlying electrodes 24 and 26 are electrically biased. An attractive force is therefore exerted on the cover top 36 to pull the cover top 36 down towards the electrodes 24 and 26. Contact between the cover 36 and electrodes 24 and 26 would cause an electrical short and device failure. Further protection against such an occurrence may be provided by establishing support posts in the area of the electrodes 24 and 26. This may be understood by reference to FIGS. 13A and 13B. FIG. 13A illustrates a cover top 36 constructed as described above in connection with FIGS. 1–12. As shown, there are substantial areas where the cover top 36 extends over the electrodes 24 without support.

Figure 13B:
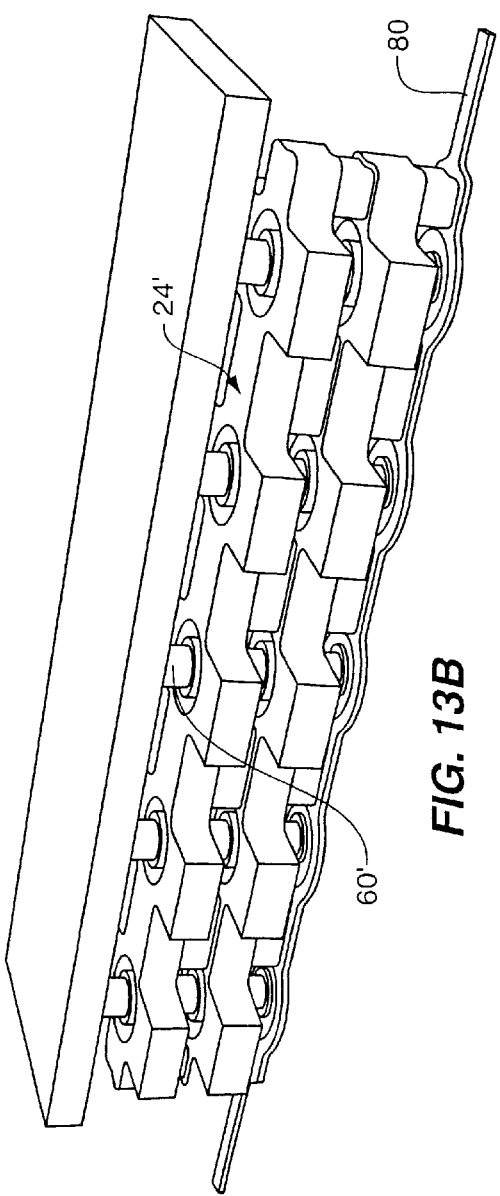
FIG. 13B is a partial perspective view of a MEM device in accordance with the present invention showing the interface between electrodes and electrically isolated support posts.

FIG. 13B illustrates a modification where electrically isolated supports 60' are provided in the area of the electrodes 24'. Such supports 60' may be provided in connection with the fixed electrodes or in connection with the movable electrodes provided that the movable electrodes are formed to accommodate movement without electrical and/or mechanical interference due to the support posts 60'. In particular, FIG. 13B illustrates electrically isolated support posts 60' extending through an electrical conductor 80 of a base structural layer and through the vertical layer stack forming a stationary electrode 24'. Although the electrically isolated supports are illustrated as supporting a cover top, it will be appreciated that such electrically isolated posts, e.g., used in connection with a stationary or movable electrode, may be used to support various types of layers overlying a MEM component, especially an active component including electrostatic and/or movable elements.

Figure 14:
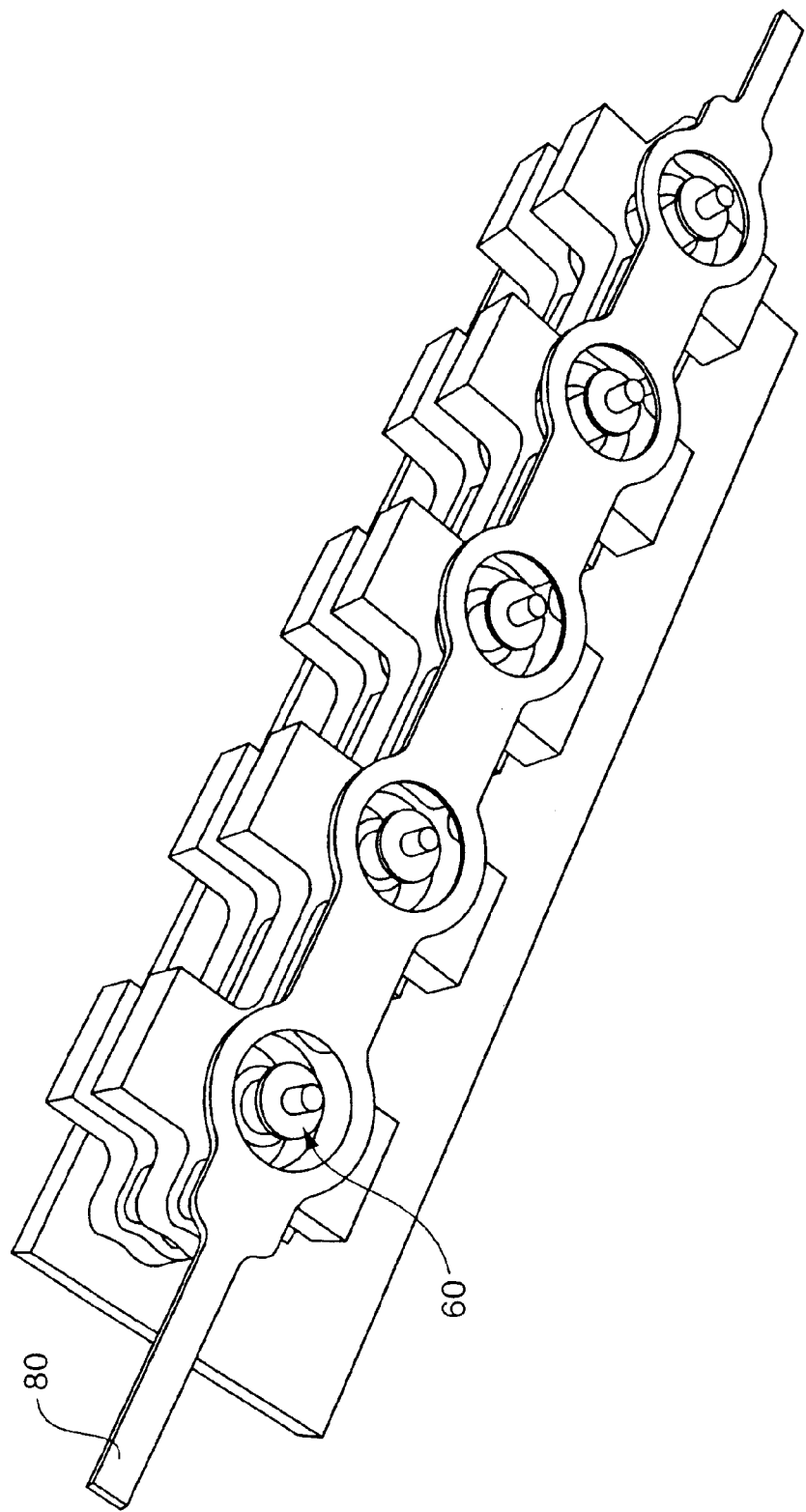
FIG. 14 is a bottom perspective view of the structure of FIG. 13B.

FIG. 14 is a bottom view, i.e., up through a transparent substrate, showing details of the anchoring of the electrically isolated support posts 60'. As shown, the voltage conductor 80 loops around each central support post 60'. Typically the support post will be held at ground potential. Optional nitride cuts under each post 60' allow the post 60' to be anchored to the substrate thereby adding mechanical rigidity and providing an electrical path to the underlying substrate on which the posts terminate.

Figure 15:
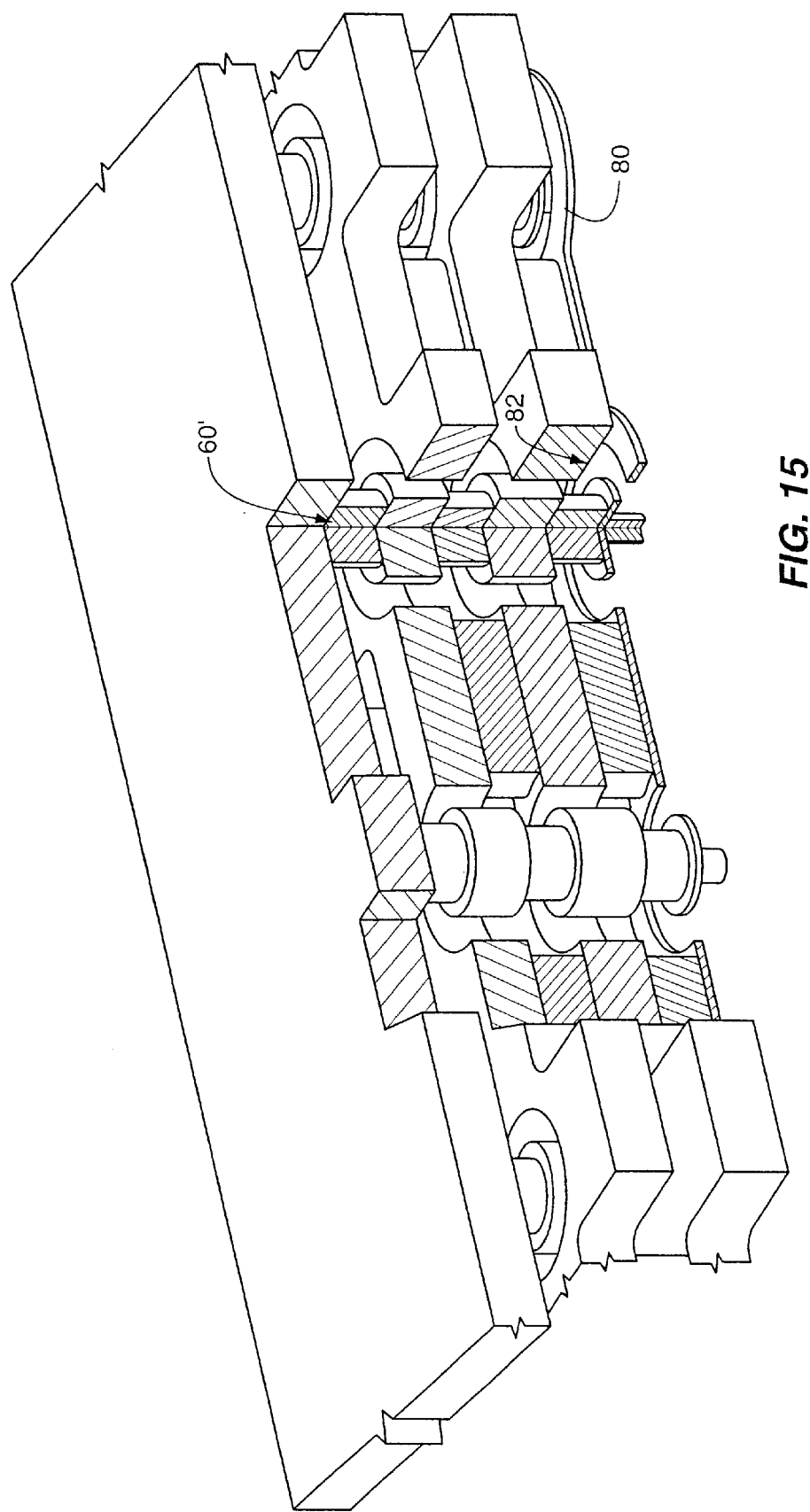
FIG. 15 is a top perspective view, partially cut away showing details of the structure of FIG. 13B.

FIG. 15 is a cut away view further showing how the isolated posts 60' extend through the layer stack and how the posts 60' interface with the voltage conductor 80. Such posts 60' may be used to serve other functions in addition to support for a cover or other overlying structure. In particular, the base structural layer of the posts 60' may be used to provide an electrical filter. As discussed above, the voltage conductor 80 is used to provide control signals to operate the actuator. In many applications, such as use of the actuators to move a micromirror of an optical cross-connect switch, very precise movement of the actuator may be required. Such precise control may be difficult due to electrical noise. Such noise may become particularly problematic in connection with increased miniaturization of the electrostatic elements. In the illustrated embodiment, a space 82 is provided between the base layer of the support post and the conductor loop. This base layer of the support posts 60', like the remainder of the support posts, is maintained at ground potential. As a result, a capacitance is provided between the support posts 60' and surrounding structure. This capacitance can serve to filter the signal transmitted through the conductor 80 on a wavelength-dependent basis, e.g., to help diminish high frequency noise, including quantization noise from D/A converters. The nature of this capacitance and the resulting filtering function can be altered as desired for particular applications through appropriate control of the post/conductor spacing, the potential difference between the post and conductor, material properties including any dopants and the like. In this manner, a cleaner drive signal can be provided to the conductor 80 for improved control.

Figure 16:
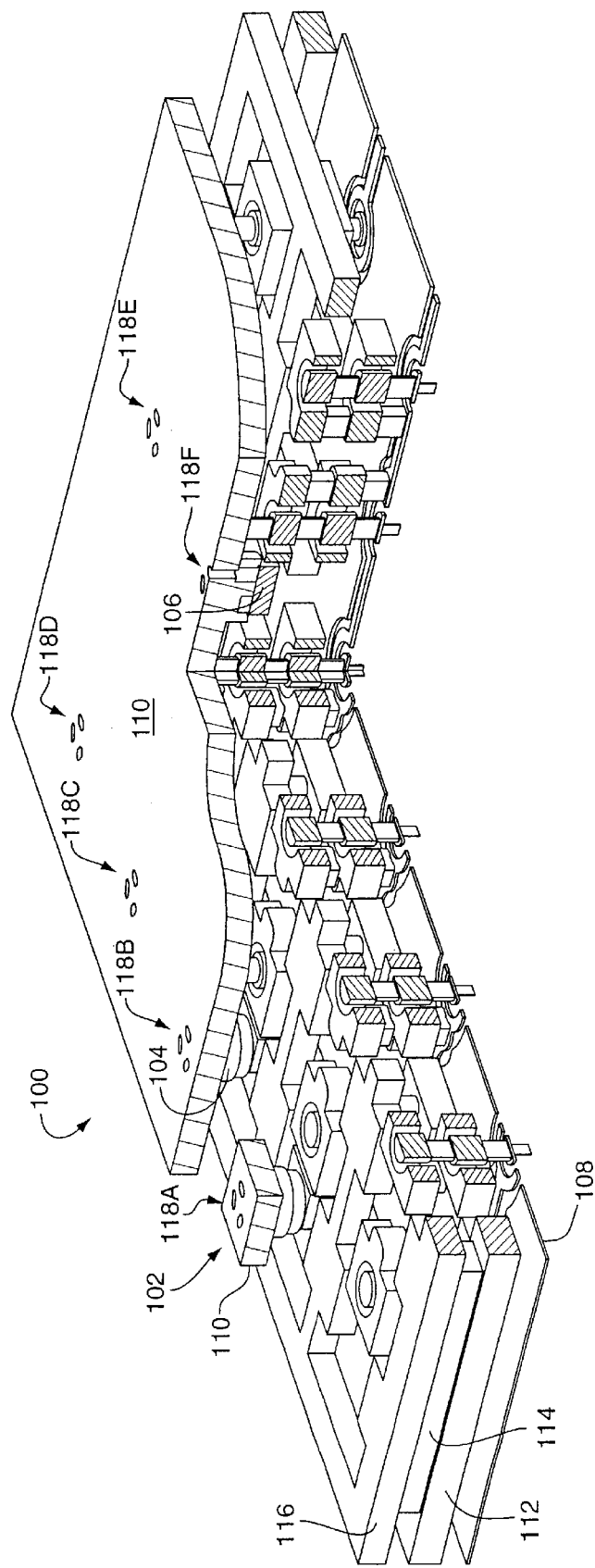
FIG. 16 illustrates an example of a microelectromechanical system configured with a filter system according to the present invention.

FIG. 16 illustrates an exemplary MEM system 100 incorporating such electrically isolated posts with integral filters and further configured with multiple particle filters, e.g., 102, 104, and 106 according to the present invention. Although these filters are illustrated and described below as depending from an overlying layer such as a cover surface, it will be appreciated that such filters could be integrated into a support wall or other structure. MEM systems constructed by MEMX, Inc. of Albuquerque, N.Mex., such as MEM system 100 may include a first layer 108 that provides electrical interconnections and as many as five or more additional layers of mechanical polysilicon layers that form functional elements ranging from simple cantilevered beams to complex microengines connected to a gear train. MEM system 100 also includes a cover 110 to protect the electrical and mechanical layers 108 and 112–116 from particle contamination. Etch release apertures 118A–F in the cover 110 provide a means to introduce etchant during the release step to remove the remaining sacrificial material and release the mechanical and electrical devices in the layers 108 and 112–116. Such etch release apertures are required to allow penetration of the etchant for releasing the structure during the final fabrication steps. The etch release apertures 118A–F are typically on the order of about 1.25 microns in size. Particle filters, e.g., 102, 104 and 106, are preferably formed around the etch release apertures 118A–F and operate to trap particles that may enter the MEM system 100 through the apertures 118A–F, thereby assuring that virtually no contamination may occur in the MEM system 100. The filters, e.g., 102–106, which are described in detail below, thus allow penetration of the etchant but impede ingress of particles of a size that may obstruct movement or cause short circuits.

Figure 17:
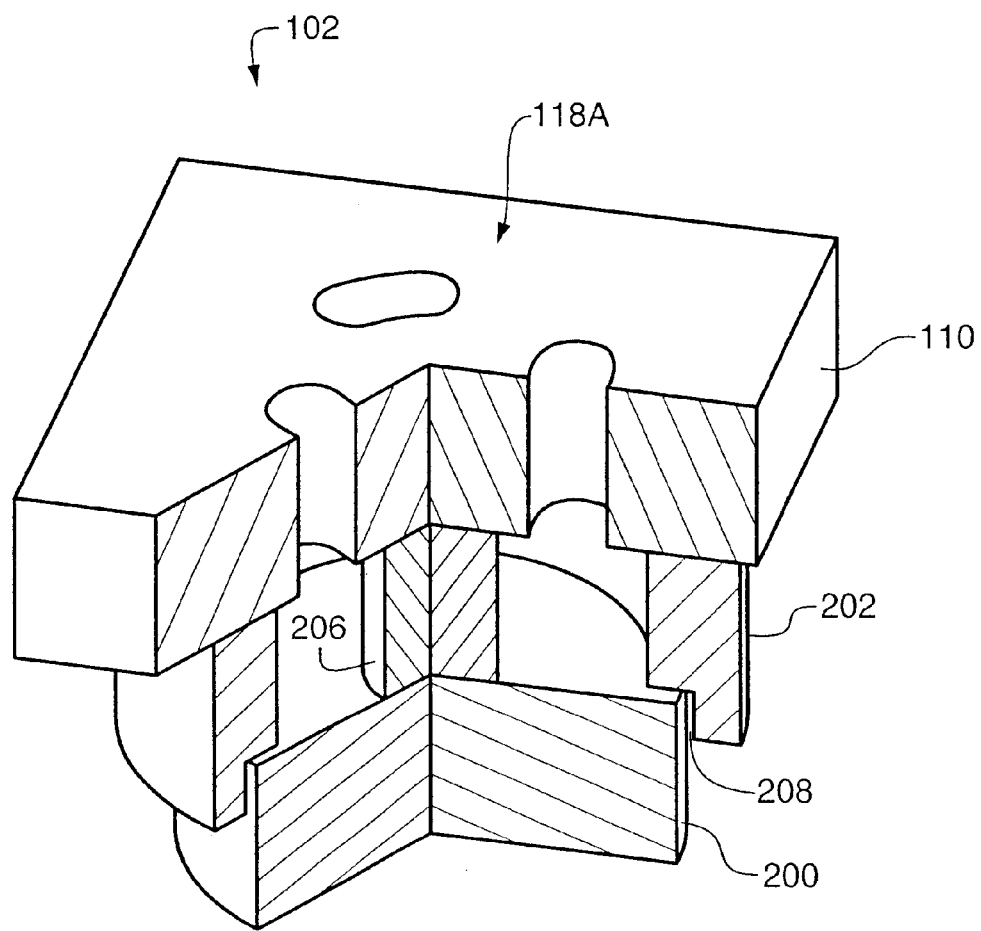
FIG. 17 illustrates an example of a filter system according to the present invention.

FIG. 17 illustrates a cut away perspective view of the particle filter 102. For purpose of illustration, the following description will now be directed toward the operation and fabrication of the illustrated particle filter 102, having an exemplary configuration and associated fabrication process. It will be appreciated however, that the following discussion applies equally to the particle filters 104 and 106, as well as other particle filters described herein, as well as other configurations and processes according to the invention.

The particle filter 102 includes a filter bottom 200 and filter wall 202. The filter wall 202 is interconnected to the filter bottom 200 by support feature 206, referred to herein as anchor post 206. The filter wall 202 may also be formed from at least one depending portion of the cover 110 over MEM system 100. In other words, a filter top may be provided by forming the filter wall 202, anchor 206 and cover 110 from the same deposition layer or integrally or otherwise interconnected layer portions in the MEM system 100.

In that regard, the filter wall 202 and filter bottom 200 define a particle trap 208 formed at the mating but non-sealably interconnected intersection of the filter wall 202 and filter bottom 200. That is, the filter wall 202 and bottom 200 interface so as to provide one or more openings dimensioned to allow penetration of etchant but capture certain particles that may have passed through an etchant aperture, e.g., 118A. As illustrated on FIG. 17, the filter wall 202 and filter bottom 200 are not actually connected, but rather, define a gap or space along the intersection that forms the particle trap 208. In this case, the anchor post 206 provides the interconnection between the filter wall 202 and filter bottom 200, via the filter top/cover 110. As may be appreciated, the dimension of the gap 208 is defined by the size of particle to be trapped within the filter 102. In this regard, the dimension of the gap 208 is preferably, in the range of 0.1 micron to 0.5 micron and more preferably is 0.2 micron. Operationally, the particle trap 208 effectively traps particles entering the particle filter 102 within the gap 208, thereby preventing the particles from contaminating the mechanical and electrical micro-devices in the layers 108 and 112–116.

FIGS. 18–26 illustrate one example of the fabrication of the particle filter 102. Only those portions of the MEM system 100 that are relevant to the present invention will be described herein. Those skilled in the, art will appreciate, however, that since the particle filter 102 is preferably fabricated using micromachining, various other combinations of depositions and surface machining that are within the scope of the present invention exist to produce particle filters according to the principles disclosed herein.

Figure 18:
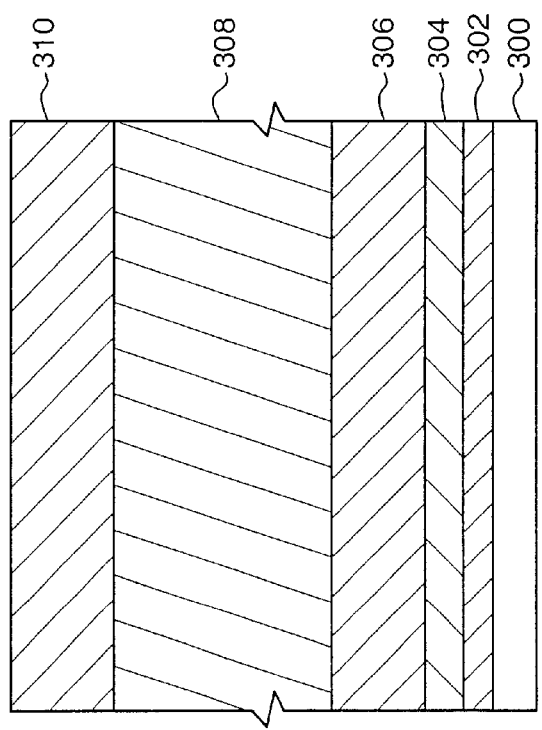
FIG. 18 illustrates an example of the fabrication of the filter system of FIG. 2.

Referring to FIG. 18, there is shown a cross sectional view of the fabrication process for the particle filter 102 completed to the structural layer 310 forming the filter bottom 200. Specifically, the structure of FIG. 3 includes a substrate 300, dielectric isolation layers, 302 and 304, a pair of sacrificial layers, 306 and 308, and a structural layer 310. It should be noted that the sacrificial layers 306 and 308 may alternatively be structural layers such as structural layers 114 and 116. However, for purposes of clarity, the fabrication of the particle filter 102 is illustrated in FIGS. 18–26 utilizing sacrificial layers 306 and 308. In other words, to provide a clearer understanding of the present invention, sacrificial layers, 306 and 308, are shown on FIGS. 18–26 rather than structural layers 114 and 116.

The dielectric isolation layers, 302 and 304, may be a thermal oxide layer and silicon nitride layer respectively, formed by a conventional thermal diffusion process as is well known in the integrated circuit art. The term "substrate" as used herein means those types of structures that can be handled by the types of equipment and processes that are used to fabricate microdevices and/or microstructures on, within, and/or from a substrate using one or more micro-photolithographic patterns.

Exemplary materials for the sacrificial layers, 306 and 308, as well as other sacrificial layers utilized to form the particle filter 102 include undoped silicon dioxide or silicon oxide, and doped silicon dioxide or silicon oxide ("doped"indicating that additional elemental materials are added to the film during or after deposition). Exemplary materials for the structural layer 310 as well as other structural layers that form the particle filter 102 include doped or undoped polysilicon and doped or undoped silicon. Exemplary materials for the substrate 300 include silicon. The various layers described herein may be formed/deposited by techniques such as chemical vapor deposition (CVD) and including low-pressure CVD (LPCVD), atmospheric-pressure CVD (APCVD), and plasma-enhanced CVD (PECVD), thermal oxidation processes, and physical vapor deposition (PVD), and including evaporative PVD, and sputtering PVD, and chemical-mechanical polishing (CMP) as examples.

Figure 19:
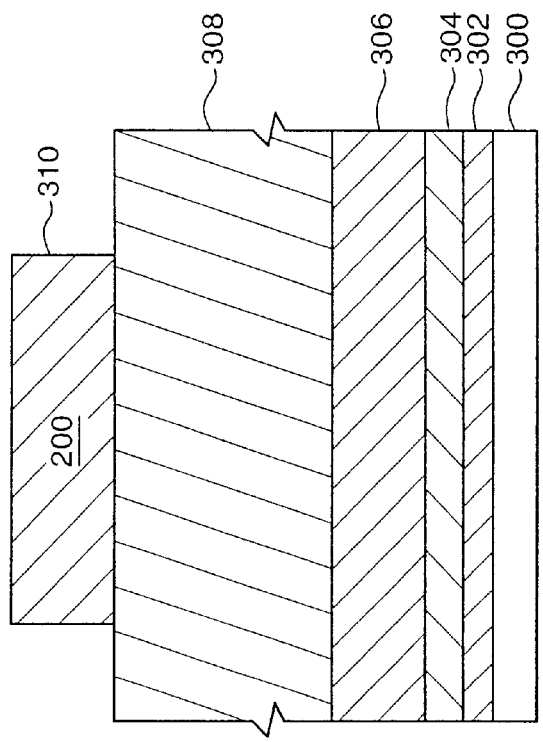
FIG. 19 illustrates additional details of the fabrication of the filter system of FIG. 2.

After formation of the structure of FIG. 18, the structural layer 310 may be patterned using photolithographic masking and etching into the shape of the filter bottom 200, as illustrated in FIG. 19. In this regard, a thin layer of light sensitive photoresist may be spun onto the layer 310. The layer 310 may then be exposed to light using a mask. After etching, the remaining photoresist may then be stripped away resulting in the structure of FIG. 19. As will become apparent from the following description, the filter bottom 200 may be patterned into a variety of shapes as a matter of design choice to accommodate different spatial configurations and limitations within a MEM system, such as MEM system 100.

Figure 21:
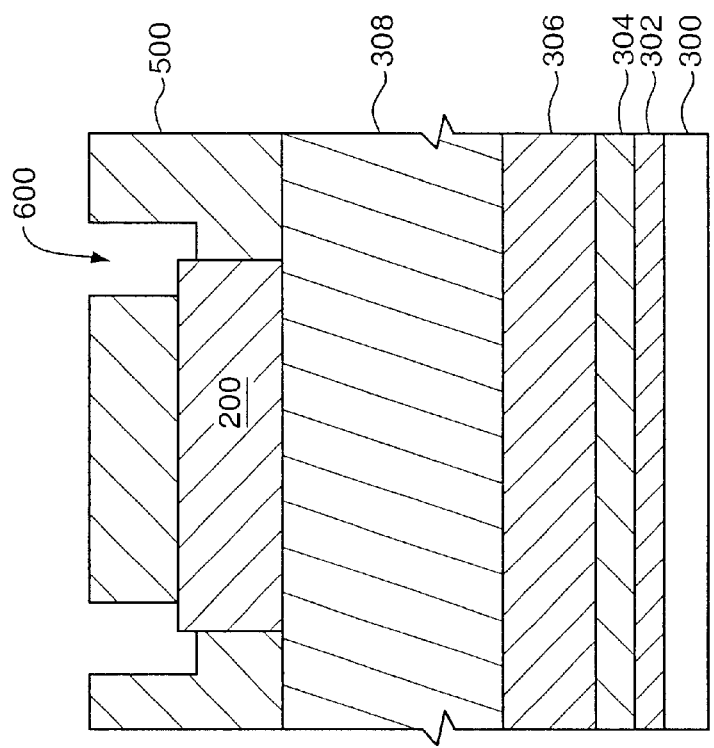
FIG. 21 illustrates additional details of the fabrication of the filter system of FIG. 2.
Figure 20:
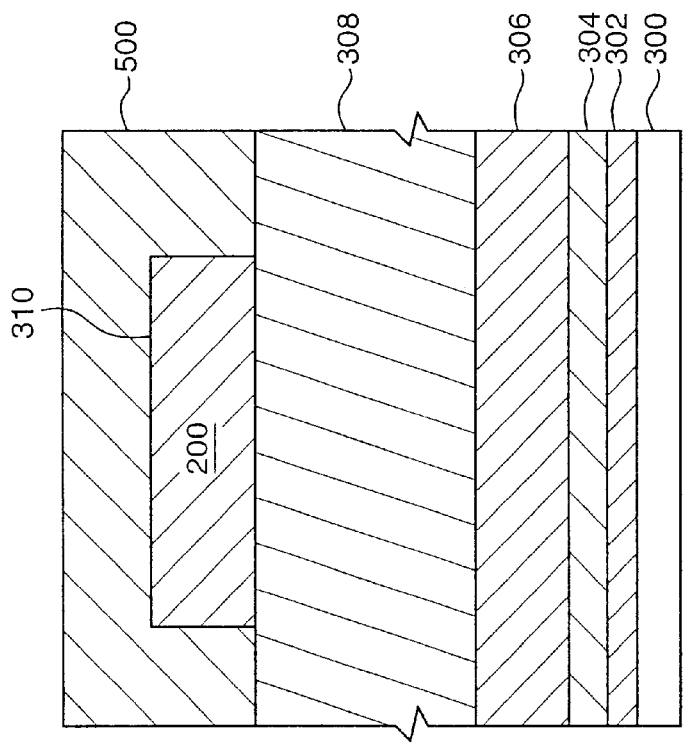
FIG. 20 illustrates additional details of the fabrication of the filter system of FIG. 2.

Referring to FIG. 20, after patterning of the filter bottom 200, another layer 500 of sacrificial material is deposited onto the patterned layer 310. It should be noted, however, that while the sacrificial layer 500 is shown in a planarized state, such as could be achieved through chemical-mechanical polishing, planarization is not necessary to the fabrication of the particle filter 102. Referring to FIG. 21, the sacrificial layer 500 is patterned using a cut etch to form a circumferential annular void 600 within the sacrificial layer 500. The circumferential annular void 600 will eventually become the filter wall 202 for the particle filter 102. It should also be noted that the void 600 is etched all the way down to the structural layer 310/filter bottom 200 and slightly overlaps the side of the structural layer 310 or in other words the top portion of the filter bottom 200. The overlap is not necessary to the formation of the particle filter 102, but rather, increases the efficiency of the particle filter 102 as it forms the lip (shown on FIG. 17) of the particle trap 208, which further restricts particles passing through the particle trap 208.

Figure 23:
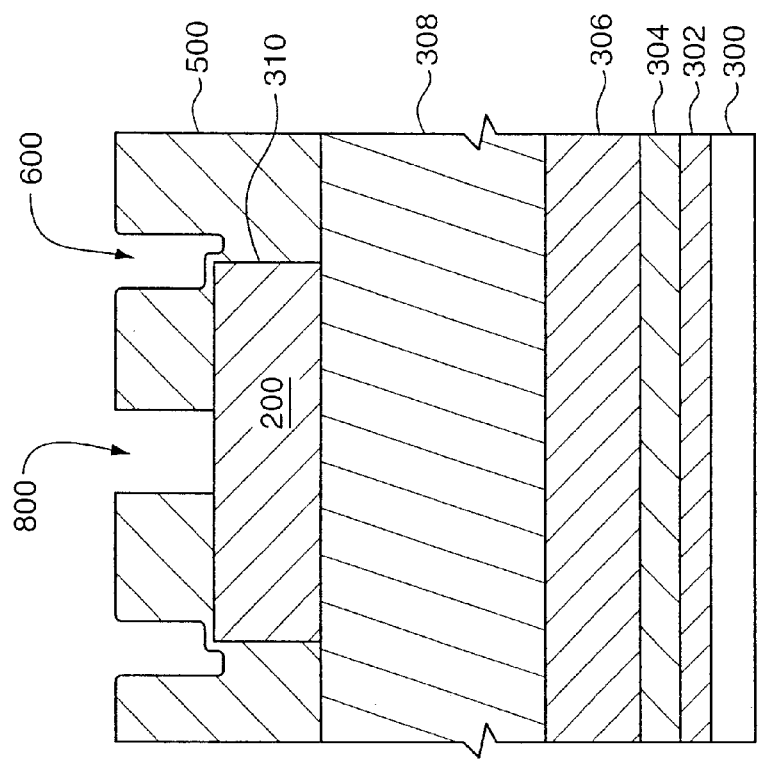
FIG. 23 illustrates additional details of the fabrication of the filter system of FIG. 2.
Figure 22:
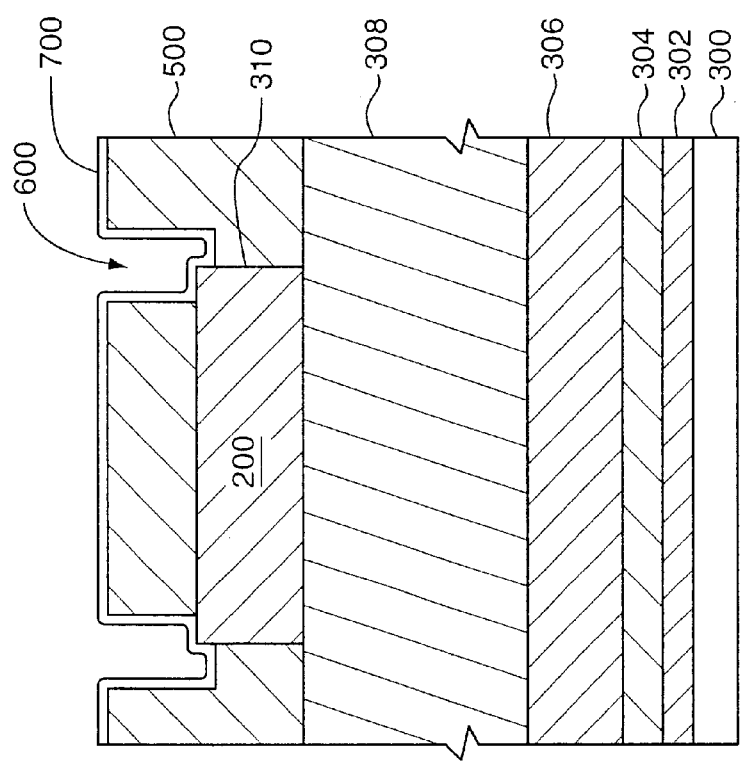
FIG. 22 illustrates additional details of the fabrication of the filter system of FIG. 2.

Referring to FIG. 22, after etching of the void 600, a thin layer of sacrificial material 700 is applied to backfill void 600. The thickness of the backfill layer 700 determines the gap spacing of the particle trap 208 and therefore is precisely controlled during the backfill process. In that regard, the thickness of the backfill layer 700 is preferably in the range of 0.1 micron to 0.5 micron and more preferably is 0.2 micron. It should also be noted since the layer 700 is the same material as the sacrificial layer 500 it essentially becomes part of the layer 500 as shown in FIG. 23. Alternatively, a timed etch to the desired depth may be utilized to form the void 600, thus eliminating the need for the backfill layer 700. As will be appreciated by those skilled in the art, however, the backfill method eliminates many of the difficulties associated with timed etching, e.g. knowledge of the precise thickness of the sacrificial layer 500. Still referring to FIG. 23, the sacrificial layer 500 including the added material of layer 700 is again patterned using a cut etch to form a substantially central annular void 800. The central annular void 800 will eventually become the anchor post 206 for the particle filter 102.

Figure 25:
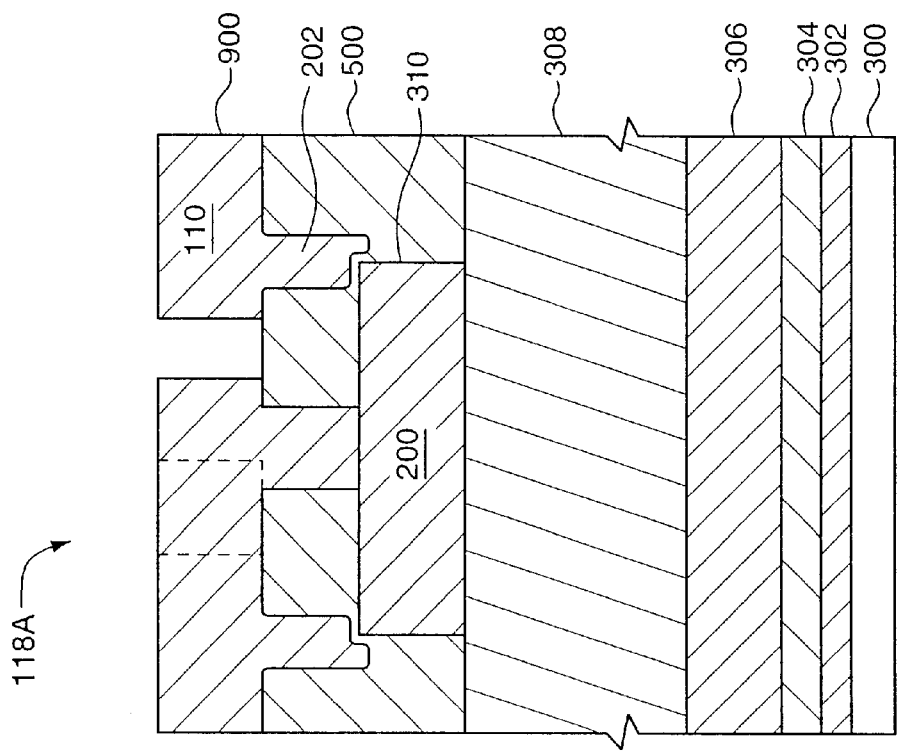
FIG. 25 illustrates additional details of the fabrication of the filter system of FIG. 2.
Figure 24:
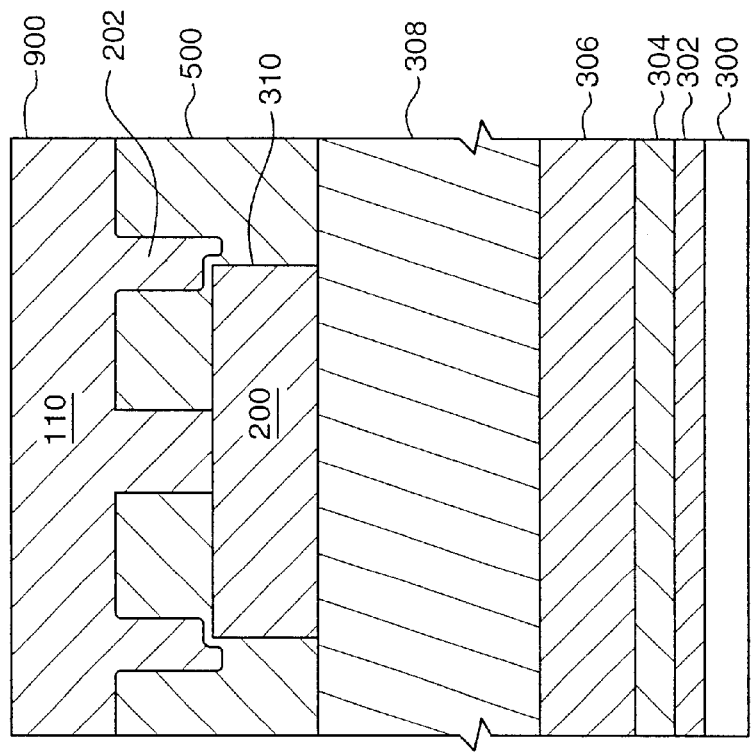
FIG. 24 illustrates additional details of the fabrication of the filter system of FIG. 2.

Referring to FIG. 24, after the sacrificial backfill layer 700 is deposited and void 800 etched, another structural layer 900 is deposited and planarized. Again as will be appreciated the planarization is not necessary to the formation and/or operation of the particle filter 102. The structural layer 900 forms the filter wall 202 and the top cover 110. Referring to FIG. 25, after deposition of the layer 900, etch release apertures 118A are cut into the layer 900 to provide the means for introducing the chemical etchant used to release the particle filter 102 and or other microdevices and/or microstructures in a MEM system, such as MEM system 100.

Figure 26:
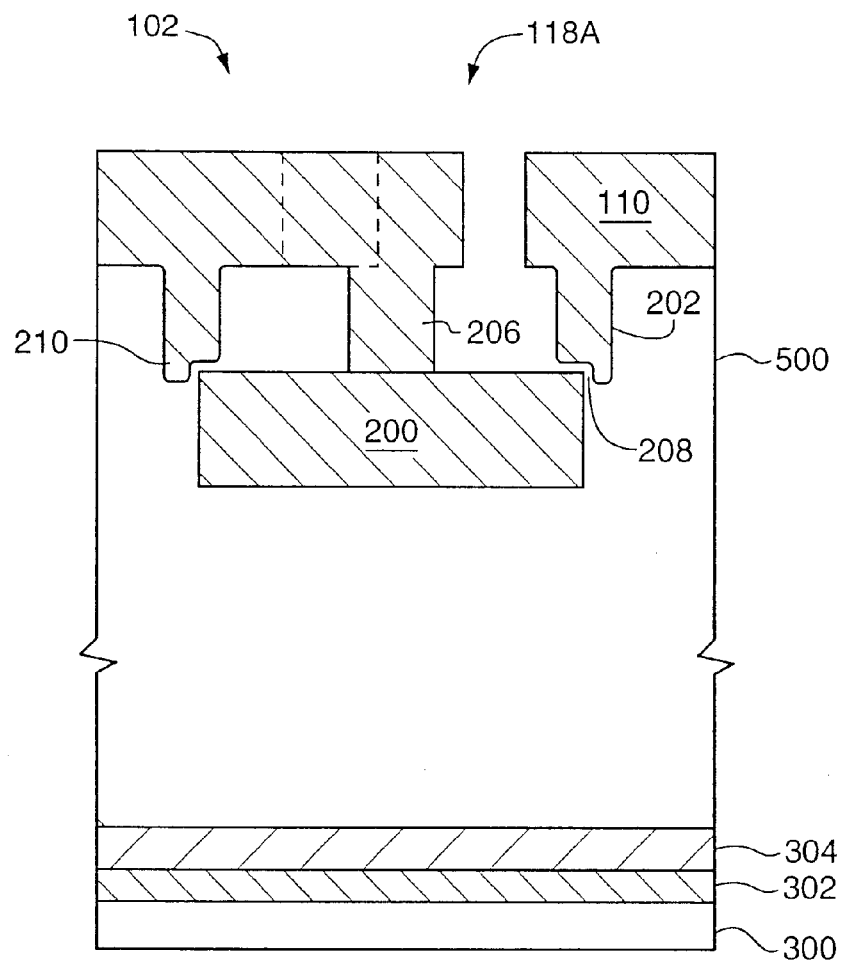
FIG. 26 illustrates additional details of the fabrication of the filter system of FIG. 2.
Figure 27:
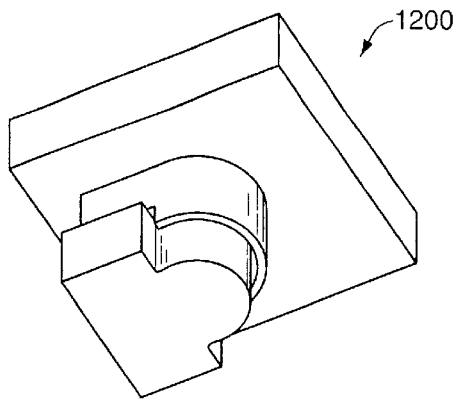
FIG. 27 illustrates another example of a filter system according to the present invention.
Figure 28:
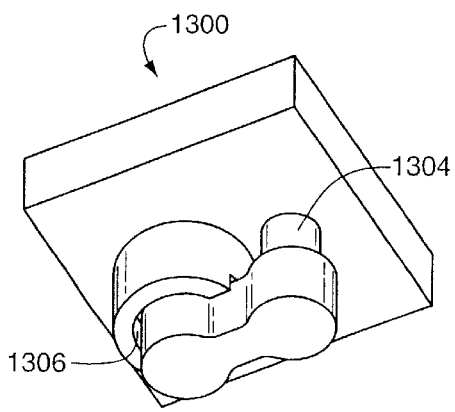
FIG. 28 illustrates another example of a filter system according to the present invention.
Figure 29:
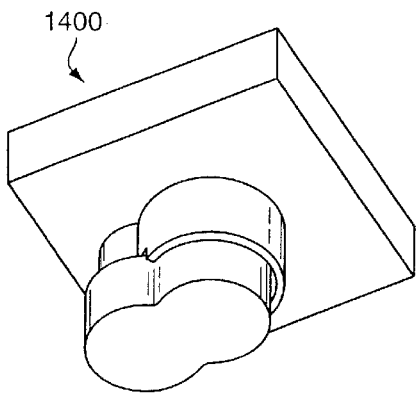
FIG. 29 illustrates another example of a filter system according to the present invention.
Figure 30:
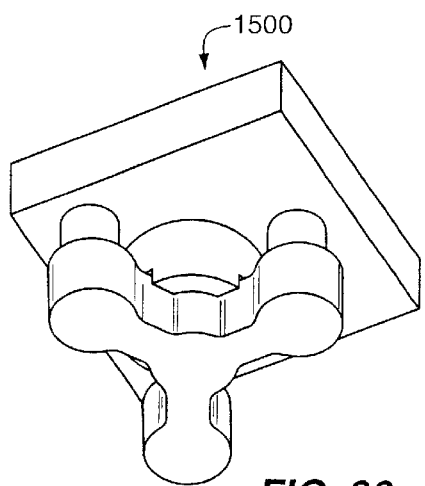
FIG. 30 illustrates another example of a filter system according to the present invention.

Referring to FIG. 26, the etch release step utilizes a selective etchant that etches away exposed portions of the sacrificial layers 306, 308, and 500 over time, while leaving the polysilicon structural layers 302, 304, and 310 intact to form/release the particle filter 102. Examples of release etchants for silicon dioxide and silicon oxide sacrificial materials are typically hydrofluoric (HF) acid based (e.g., undiluted or concentrated HF acid, which is actually 49 wt % HF acid and 51 wt % water; concentrated HF acid with water; buffered HF acid (HF acid and ammonium fluoride)).

The completed particle filter 102 is supported in the MEM system 100 by the filter top/cover 110, which in turn supports the filter bottom 200 via the anchor post 206. Advantageously, this permits the formation of the particle trap 208 around the etch release apertures 118A. Also advantageously, in this regard, the particle filter 102 virtually eliminates the possibility of particle contamination as particles entering through the etch release apertures 118A are trapped by the particle trap 208. As stated above, the etch release apertures are on the order 1.25 microns in size while the particle trap is on the order of 0.2 micron in size.

Referring to FIGS. 27–30, a further advantage of the present invention is provided through various alternative embodiments of the present particle filter. The present particle filter can be constructed in a variety of geometrical shapes as a matter of design choice. Those skilled in the art will appreciate the slight variations in etching to achieve the various designs illustrated in FIGS. 27–30, and thus, a description is omitted for the purpose of brevity. Additionally, those skilled in the art will appreciate that the particle filters 1200–1500 are for purpose of illustration and not limitation and that numerous other designs can be formed according to the principles of the present invention.

The particle filters 1200–1500 operate substantially similarly to the particle filter 102 in that they include a particle trap defined by mating, but non-interconnected surfaces, of a filter wall and a filter bottom connected to the filter wall through a support feature. The particle filters 1200–1500, however, provide the advantage of accommodating various different spatial limitations created by the different microstructures that can be included in a MEM system such as MEM system 100. For example, particle filter 1300 includes a slightly smaller filter bottom and is externally supported by an anchor post 1304. Particle filters 1200, 1400 and 1500 all include variations of the principles of the present invention and may be incorporated into one or more MEM systems as a matter of design choice. In addition, it will be appreciated that a MEM system, such as system 100, could include one or more of the different filter designs, e.g. 102, and 1200–1500, in a single system as a matter of design choice.

Those skilled in the art will appreciate variations of the above-described embodiments that fall within the scope of the invention. As a result, the invention is not limited to the specific examples and illustrations discussed above, but only by the following claims and their equivalents.

What is claimed:

1. A MEM apparatus, comprising:
    a substrate;
    an active component supported on said substrate;
    a cover, supported on said substrate having an upper surface, defined by peripheral edges, extending at least partially over said active component; and
    at least one support structure disposed under said cover interior of said peripheral edges, for supporting said cover.

2. A MEM apparatus as set forth in claim 1, wherein said active component comprises a movable electrode.

3. A MEM apparatus as set forth in claim 1, wherein said active component comprises a static electrode.

4. A MEM apparatus as set forth in claim 1, wherein said active component includes a movable electrode and a static electrode.

5. A MEM apparatus as set forth in claim 4, wherein said support structure is positioned proximate to said static electrode.

6. A MEM apparatus as set forth in claim 1, wherein said cover includes a sidewall structure extending around at least a portion of said peripheral edges.

7. A MEM apparatus as set forth in claim 6, wherein said sidewall structure extends around substantially the full extent of said peripheral edges.

8. A MEM apparatus as set forth in claim 1, wherein said support structure has a height, relative to an axis extending between said upper surface and said substrate, greater than a height of said active component, wherein said support structure maintains a separation between said upper surface and said active component.

9. A MEM apparatus as set forth in claim 1, wherein said at least one support structure comprises multiple support structures distributed across an area of said cover.

10. A MEM apparatus as set forth in claim 1, wherein said support structure is substantially electrically isolated from said active component.

11. A MEM apparatus as set forth in claim 1, wherein said active component comprises a movable component that is movable across a range of positions and said support structure is positioned to avoid mechanical interference with said movable component as said movable component moves across said range of positions.

12. A MEM apparatus as set forth in claim 1, wherein said active component comprises an electrical lead and said apparatus further comprises a filter, supported on said substrate, for filtering an undesired electrical component from said lead.

13. An apparatus as set forth in claim 12, wherein said filter comprises structure for establishing a capacitance between said structure and said electrical lead.

* * * * *